United States Patent
Dong et al.

(12)

(10) Patent No.: US 10,783,295 B1
(45) Date of Patent: Sep. 22, 2020

(54) NETLIST PARTITIONING FOR DESIGNS TARGETING A DATA PROCESSING ENGINE ARRAY

(71) Applicant: Xilinx, Inc., San Jose, CA (US)

(72) Inventors: Xiao Dong, San Jose, CA (US); Grigor S. Gasparyan, San Jose, CA (US); Abhishek Joshi, San Jose, CA (US)

(73) Assignee: XILINX, INC., San Jose, CA (US)

( * ) Notice: Subject to any disclaimer, the term of this patent is extended or adjusted under 35 U.S.C. 154(b) by 0 days.

(21) Appl. No.: 16/399,493

(22) Filed: Apr. 30, 2019

(51) Int. Cl.
*G06F 30/00* (2020.01)
*G06F 30/327* (2020.01)
*G06F 30/34* (2020.01)

(52) U.S. Cl.
CPC ............ *G06F 30/327* (2020.01); *G06F 30/34* (2020.01)

(58) Field of Classification Search
CPC ............................... G06F 30/327; G06F 30/34
See application file for complete search history.

(56) References Cited

U.S. PATENT DOCUMENTS

| | | | |
|---|---|---|---|
| 5,757,658 A | 5/1998 | Rodman et al. | |
| 6,243,851 B1 | 6/2001 | Hwang et al. | |
| 6,457,164 B1 | 9/2002 | Hwang et al. | |
| 6,952,816 B2 * | 10/2005 | Gupta | G06F 30/30 716/103 |
| 7,237,214 B1 * | 6/2007 | Pandey | G06F 30/392 716/131 |
| 7,353,485 B1 | 4/2008 | Kannan et al. | |
| 7,653,884 B2 | 1/2010 | Furnish et al. | |
| 7,669,160 B2 | 2/2010 | Furnish et al. | |
| 8,312,405 B1 | 11/2012 | Slonim et al. | |
| 8,332,793 B2 | 12/2012 | Bose | |
| 8,522,185 B1 | 8/2013 | Balzli, Jr. | |
| 9,015,689 B2 | 4/2015 | Bai et al. | |
| 9,147,025 B2 * | 9/2015 | Feng | G06F 30/392 |

FOREIGN PATENT DOCUMENTS

WO 2008022076 A2 2/2008

* cited by examiner

*Primary Examiner* — Naum Levin
(74) *Attorney, Agent, or Firm* — Patterson + Sheridan, LLP

(57) ABSTRACT

An example method for compiling includes, by a processor-based system: obtaining a netlist of an application, the netlist containing program nodes and respective edges between the program nodes, the application to be implemented on a device comprising an array of data processing engines; partitioning the netlist into a plurality of partitions; for each of the plurality of partitions: generating a global mapping of the program nodes based on a representation of the array of data processing engines and using an integer linear programming (ILP) algorithm; generating a detailed mapping of the program nodes based on the global mapping; and translating the detailed mapping for each of the plurality of partitions to a file.

20 Claims, 10 Drawing Sheets

US 10,783,295 B1

NETLIST PARTITIONING FOR DESIGNS TARGETING A DATA PROCESSING ENGINE ARRAY

TECHNICAL FIELD

This disclosure relates to compiling at least some of an application for execution in an array of data processing engines (DPEs) on an integrated circuit and, more particularly, to netlist partitioning for designs targeting a data processing engine array.

BACKGROUND

A programmable integrated circuit (IC) refers to a type of IC that includes programmable circuitry. An example of a programmable IC is a field programmable gate array (FPGA). An FPGA is characterized by the inclusion of programmable circuit blocks. Circuit designs may be physically implemented within the programmable circuitry of a programmable IC by loading configuration data, sometimes referred to as a configuration bitstream, into the device. The configuration data may be loaded into internal configuration memory cells of the device. The collective states of the individual configuration memory cells determine the functionality of the programmable IC. For example, the particular operations performed by the various programmable circuit blocks and the connectivity between the programmable circuit blocks of the programmable IC are defined by the collective states of the configuration memory cells once loaded with the configuration data.

Circuit designs could be created by generating circuits using primitives and/or writing hardware description language (HDL) code. Configuration data is then generated from the primitives and/or HDL, including placing logic and routing between the placed logic. Various verification and validation methods could be implemented to ensure the proper functioning of the circuit design.

SUMMARY

In an example, a method for compiling includes, by a processor-based system: obtaining a netlist of an application, the netlist containing program nodes and respective edges between the program nodes, the application to be implemented on a device comprising an array of data processing engines; partitioning the netlist into a plurality of partitions; for each of the plurality of partitions: generating a global mapping of the program nodes based on a representation of the array of data processing engines and using an integer linear programming (ILP) algorithm; generating a detailed mapping of the program nodes based on the global mapping; and translating the detailed mapping for each of the plurality of partitions to a file.

In an example, a non-transitory computer readable medium having stored thereon instruction that when executed by a processor cause the processor to perform a method for compiling, the method comprising: obtaining a netlist of an application, the netlist containing program nodes and respective edges between the program nodes, the application to be implemented on a device comprising an array of data processing engines; partitioning the netlist into a plurality of partitions; for each of the plurality of partitions: generating a global mapping of the program nodes based on a representation of the array of data processing engines and using an integer linear programming (ILP) algorithm; generating a detailed mapping of the program nodes based on the global mapping; and translating the detailed mapping for each of the plurality of partitions to a file.

In an example, a design system comprising: a processor; and a memory coupled to the processor, the memory storing instruction code, the processor being configured to execute the instruction code to perform: obtaining a netlist of an application, the netlist containing program nodes and respective edges between the program nodes, the application to be implemented on a device comprising an array of data processing engines; partitioning the netlist into a plurality of partitions; for each of the plurality of partitions: generating a global mapping of the program nodes based on a representation of the array of data processing engines and using an integer linear programming (ILP) algorithm; generating a detailed mapping of the program nodes based on the global mapping; and translating the detailed mapping for each of the plurality of partitions to a file.

These and other aspects may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
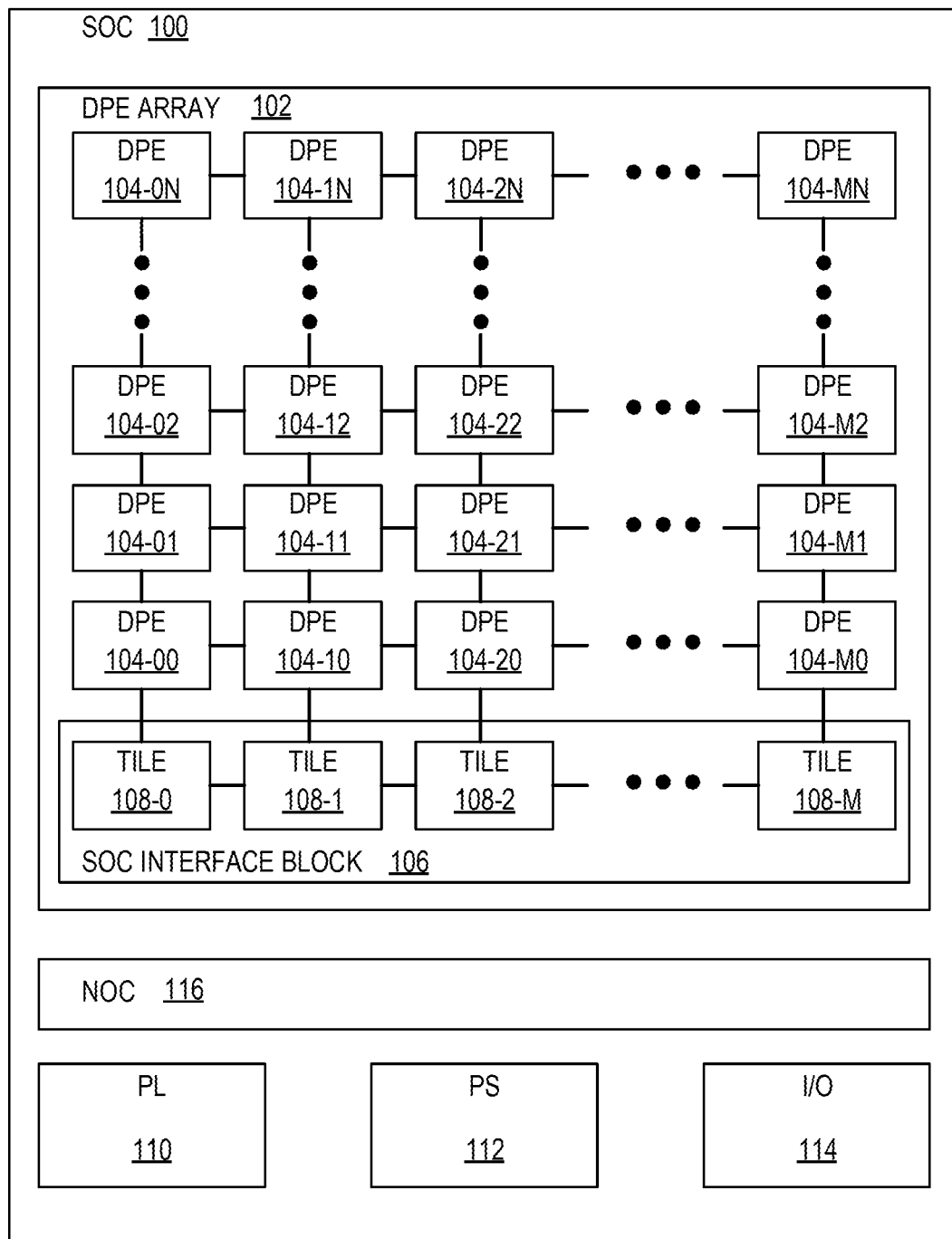
FIG. 1 depicts an architecture for a System-on-Chip (SoC) according to some examples.

Some examples described herein relate to compiling at least some of an application for a data processing engine (DPE) array of an integrated circuit (IC). Various examples described herein relate to partitioning a netlist of an application for mapping of the partitioned netlist to components of the DPE array. Various examples described herein relate to global mapping or placement of a netlist (e.g., a partitioned netlist) to components of the DPE array, while further examples described herein relate to detailed mapping or placement of the netlist to components of the DPE array.

According to some examples, a DPE array refers to a plurality of hardwired circuit blocks. The plurality of circuit blocks may be programmable. A DPE array may include a plurality of DPEs and a System-on-Chip (SoC) interface block. In general, a DPE includes a hardened core that is capable of providing data processing capabilities. A DPE may also include a memory module that is accessible by the core. A DPE further may include a DPE interconnect. The DPE interconnect refers to circuitry that is capable of implementing communications with other DPEs of a DPE array and/or communications with different subsystems of the IC including the DPE array. The DPE array of an IC is provided herein as an example architecture for which an application can be compiled. Compiling for other architectures, with or without a DPE array, is also within the scope of other examples.

In examples, the tools described herein use Integer Linear Programming (ILP) solver-based techniques for globally placing the design. Without dividing the design into smaller sub-graphs, the tool runtimes can be high. A design netlist includes components where certain edges can be cut and the related components can be placed far away without incurring any penalty. Also, certain components need to be placed next to one another to avoid a high penalty. This mismatch in the requirements is an indicator that splitting the design into smaller sub-graphs can make the problem faster to solve without causing degradation in the quality of the solution. Further, some wireless communication application designs have a common feature where the design comprises a number of smaller, but identical, sub-graphs. In such a scenario, partitioning the design becomes critical, since the tools can focus on placing one small sub-graph and using that solution for other identical sub-graphs. This reduces runtime significantly and provides for structured placement results. Accordingly, techniques for partitioning netlists prior to placement are described herein.

In some examples, global mapping generally maps program nodes (such as kernels and input/output nodes from/to programmable logic) of the netlist of the application to DPEs and tiles of the SoC interface block. The terms "mapping" and "placement" are used herein interchangeably. Some examples of global mapping herein attempts to map clusters of kernels to cores of DPEs to minimize communications by direct memory access (DMA), to assign buffers to memory groups of DPEs to minimize the number of buffers mapped to a memory bank, and/or to map clusters of kernels to cores of DPEs and input/output nodes to tiles to minimize wirelength between two clusters of kernels connected by a streaming edge, and between clusters of kernels and input/output nodes. Some algorithms described herein for global mapping use an integer linear programming (ILP) algorithm, although other algorithms can be implemented. Subsequent detailed placement can map buffers to specific memory banks and subsequent routing can route nets through the various networks of the DPE array.

In examples, after global mapping and placement, the tools perform detailed placement. In global placement, the tools assign buffers to memory groups and programmable logic input/outputs (IOs) to incoming/outgoing nodes in the interface between the DPE array and programmable logic (referred to herein as the SoC interface block). In the detailed placement phase, the tools formulate the problem of assigning the programmable logic IOs (PLIOs) to individual channels within the SoC interface block. The tools also assign the buffers to individual memory banks along with the assignment of an offset value within a memory bank. Accordingly, techniques are detailed placement of designs in a DPE array are described.

Some examples described herein are described in the context of a heterogeneous data processing architecture. More specifically, for example, the architecture described below includes (i) programmable logic regions (e.g., fabric of a field programmable gate array (FPGA)) that are capable of being configured to process data, (ii) a processing system, and (iii) DPEs, each with a core, that are also capable of being programmed to process data. Some examples can be extended to homogeneous data processing architectures, such as, for example, multi-core processors (e.g., without programmable logic regions). Such multi-core processors can have a large number of resources available for executing an application and can benefit from aspects of examples described herein.

A heterogeneous data processing architecture such as described herein can permit execution of an application and communication across one or more programmable logic regions, a processing system, and a DPE array. Some examples described herein provide separate compiler modules on a processor-based system that are capable of compiling respective partitions of an application to generate binaries and bitstreams that are capable of being loaded onto and executed by an IC that implements a heterogeneous data processing architecture.

Due to the novelty of the heterogeneous data processing architecture described herein, no processor-based system (e.g., a computer) was available for compiling an application to be executed on an IC having the heterogeneous data processing architecture. An aspect of an architecture described herein is that a DPE array can be completely programmable, including a communication network through which cores of the DPE array can communicate. No compiler was previously available to compile an application that would generate binaries to program hardened (e.g., hardwired) processor cores and a communication network through which the processor cores were configured to communicate. Historically, hardened multi-processor cores would communicate via sharing a dedicated memory space and not through a programmable network or through memory spaces that can be determined at compiling. Accordingly, a technical problem existed in that no processor-based system was available to compile an application to be executed by an IC having the heterogeneous data processing architecture. Some examples provide a solution to this problem by implementing separate compiler modules on a processor-based system, at least one of which is capable of generating and compiling kernels with buffers that are mapped on hardened cores and memory groups of the DPE array.

Techniques and processor-based systems for placing logic in programmable logic of programmable logic devices (e.g., fabric of an FPGA) have been implemented previously. However, these techniques and processor-based systems have proven to be problematic when being translated and modified to mapping within a DPE array as described herein. An architecture described herein can be highly complex and large. The complexity and scale of the architecture could cause modifications of previous techniques and processor-based systems to not converge on a solution or to time out before a solution could be obtained. Accordingly, a technical problem existed in that no processor-based system was available to compile and map kernels and input/output nodes to components within a DPE array of an architecture as described herein. Some examples provide a solution to this problem by implementing global mapping and detailed mapping. Global mapping can map program nodes of the netlist to components within the DPE array using a mapping algorithm that can quickly and efficiently converge to a solution. With the global mapping, detailed mapping can map components of the netlist to specified hardware within the DPE array by using the narrower search space created by the global mapping. Some examples use ILP algorithms for the global and detailed mapping. Implementations of such examples were capable of global and detailed mapping much faster than modifications of prior techniques and processor-based systems, if modifications of prior techniques and processor-based systems were able to converge on a solution.

Aspects of these and other examples are described below. Additional or other benefits may be achieved by various examples, as a person having ordinary skill in the art will readily understand upon reading this disclosure.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the claimed invention or as a limitation on the scope of the claimed invention. In addition, an illustrated example need not have all the aspects or advantages shown. An aspect or an advantage described in conjunction with a particular example is not necessarily limited to that example and can be practiced in any other examples even if not so illustrated or if not so explicitly described.

Further, methods described herein may be described in a particular order of operations, but other methods according to other examples may be implemented in various other orders (e.g., including different serial or parallel performance of various operations) with more or fewer operations. Various directions or orientations are described as, e.g., a column and a row; horizontal and vertical; and bottom or below, top or above, left, and right. These designations are for ease of description, and other directions or orientations may be implemented. Algorithms described herein may also be described as minimizing or optimizing (or other similar terminology) some, e.g., solution; however, such terminology does not necessarily indicate a most minimal solution or most optimized solution.

FIG. 1 illustrates an architecture for a System-on-Chip (SoC) 100 according to some examples. The architecture of FIG. 1 and following figures is provided as an example to illustrate aspects of further examples below. The architecture can be modified with any number of variations, some of which may be identified in the following description.

The SoC 100 includes a DPE array 102. The DPE array 102 includes a plurality of interconnected DPEs 104-00 through 104-MN (collectively or individually, DPE(s) 104). Each of the DPEs 104 is a hardwired circuit block and may be programmable. The DPE array 102 further includes a SoC interface block 106 that includes tiles 108-0 through 108-M (collectively or individually, tile(s) 108). Each of the tiles 108 of the SoC interface block 106 may be hardwired and programmable. The SoC interface block 106 provides an interface between DPEs 104 of DPE array 102 and other portions (e.g., subsystems) of the SoC 100.

In the example of FIG. 1, the DPE array 102 includes a two-dimensional array of DPEs 104 and the SoC interface block 106. The DPE array 102 may be implemented using any of a variety of different architectures. FIG. 1 illustrates DPEs 104 arranged in aligned rows and aligned columns. The DPE array 102 has M+1 columns of DPEs 104 and N+1 rows of DPEs 104. The reference numerals of the DPEs 104 in FIG. 1 indicate the positioning of each DPE 104 by the reference number "104-[column][row]." In some examples, DPEs 104 may be arranged where DPEs 104 in selected rows and/or columns are horizontally inverted or flipped relative to DPEs 104 in adjacent rows and/or columns. In other examples, rows and/or columns of DPEs 104 may be offset relative to adjacent rows and/or columns. The DPEs 104 may be implemented as generally described in further detail below.

DPEs 104 are interconnected by DPE interconnects, which, when taken collectively, form a DPE interconnect network. Each DPE 104 is connected to vertically neighboring DPE(s) 104 and horizontally neighboring DPE(s) 104. For example, DPE 104-11 is connected to vertically neighboring DPEs 104 within column 1, which are DPEs 104-10 and 104-12, and is connected to horizontally neighboring DPEs 104 within row 1, which are DPEs 104-01 and 104-21. DPEs 104 at a boundary of the DPE array 102 may be connected to fewer DPEs 104. Additional details of these connections are described below. Other connections can be implemented, such as in different architectures of the DPE array 102.

In some examples, the SoC interface block 106 is coupled to adjacent DPEs 104. For example, as illustrated in FIG. 1, the SoC interface block 106 may be connected to each DPE 104 in the bottom row of DPEs 104-x0 in the DPE array 102 (where "x" indicates a given column). More particularly, in FIG. 1, each tile 108 of the SoC interface block 106 is connected to a neighboring DPE 104 within the column of the DPE array 102 in which the respective tile 108 is disposed. In FIG. 1, tile 108-0 is connected to DPE 104-00; tile 108-1 is connected to DPE 104-10; tile 108-2 is connected to DPE 104-20; etc. Additionally, each tile 108 is connected to neighboring tiles 108. The SoC interface block 106 is capable of communicating data through the tiles 108, e.g., of propagating data from tile 108-0 to tile 108-1, from tile 108-1 to tile 108-2, etc., and vice versa. A tile 108 within the SoC interface block 106 can communicate with a DPE 104 to which the tile 108 is connected, and the communication can be routed through the DPE interconnect network formed by the interconnected DPEs 104 to a target DPE 104.

The SoC interface block 106 is capable of coupling the DPEs 104 within DPE array 102 with one or more other subsystems of the SoC 100. For example, in FIG. 1, the SoC 100 includes programmable logic (PL) 110, a processor system (PS) 112, input/output blocks (I/O) 114, and a Network-on-Chip (NoC) 116. The SoC 100 can further include any other hardwired circuit blocks. Each of the PL 110, PS 112, I/O 114, and any other hardwired circuit blocks can be interconnected via the NoC 116. The SoC interface block 106 is capable of establishing connections between any of the DPEs 104 and the PL 110. The SoC interface block 106 is also capable of establishing connections between any of the DPEs 104 and the NoC 116. Through the NoC 116, the DPEs 104 are capable of communicating with the PS 112, I/O 114, and/or other hardwired circuit blocks. In some examples, DPEs 104 are capable of communicating with hardwired circuit blocks via the SoC interface block 106 and the PL 110. In some examples, the SoC interface block 106 may be connected to one or more subsystems of the SoC 100. For example, the SoC interface block 106 may be connected to the PS 112, I/O 114, and/or to other hardwired circuit blocks.

The NoC 116 is programmable to establish connectivity between different master circuits and different slave circuits of a user circuit design. The NoC 116 may be programmed by loading configuration data into internal configuration registers that define how elements within the NoC 116, such as switches and interfaces, operate to pass data from switch to switch and among the NoC interfaces. The NoC 116 may be programmed to route data, e.g., application data and/or configuration data, among the master and slave circuits of the user circuit design.

The PL 110 is circuitry that may be programmed to perform specified functions. As an example, the PL 110 may be implemented as FPGA circuitry. The PL 110 may include an array of programmable circuit blocks. Examples of programmable circuit blocks within the PL 110 include input/output blocks (IOBs), configurable logic blocks (CLBs), random access memory blocks (BRAM), digital signal processing blocks (DSPs), clock managers, and/or delay lock loops (DLLs). Each programmable circuit block within the PL 110 typically includes both programmable interconnect circuitry and programmable logic circuitry. The programmable interconnect and programmable logic circuitries may be programmed by loading configuration data into internal configuration memory cells that define how the programmable elements are configured and operate. Any number of different sections of PL 110 may be implemented in the SoC 100.

The PS 112 may be implemented as, or include, any of a variety of different processor types. For example, the PS 112 may be implemented as an individual processor, e.g., a single core capable of executing program instruction code. In another example, the PS 112 may be implemented as a multi-core processor. In still another example, the PS 112 may include one or more cores, modules, co-processors, interfaces, and/or other resources. The PS 112 may be implemented using any of a variety of different types of architectures. Example architectures that may be used to implement the PS 112 may include an ARM processor architecture, an x86 processor architecture, a graphics processing unit (GPU) architecture, a mobile processor architecture, a DSP architecture, or other suitable architecture that is capable of executing computer-readable instruction code or program code.

The I/O 114 can be implemented as eXtreme Performance Input/Output (XPIO), multi-gigabit transceivers (MGTs), or any other input/output blocks. Other circuit blocks may be implemented as any of a variety of different hardwired circuit blocks. For example, Analog-to-Digital Converters (ADC), Digital-to-Analog Converters (DAC), or other circuits can be implemented.

The DPEs 104 can communicate various data by different mechanisms within the DPE array 102. As described in detail below, DPEs 104 are interconnected by a stream network of the DPE interconnect that includes interconnected stream switches. Application data and direct memory accesses (DMAs) may be communicated between the DPEs 104 via the stream network. The DPEs 104 are also interconnected by a memory mapped network of the DPE interconnect that includes interconnected memory mapped switches. Configuration and control data can be communicated between the DPEs 104 via the memory mapped network. Neighboring DPEs 104 can further communicate via shared memory. An independent cascade stream can be implemented between DPEs 104.

The SoC interface block 106 is an interface between the DPEs 104 and (i) the PL 110 and (ii) the NoC 116. Each tile 108 can service a subset of DPEs 104 in the DPE array 102. In the example of FIG. 1, each tile 108 services the column of DPEs 104 above the respective tile 108. The tiles 108 also include stream switches, which are interconnected in the stream network to stream switches of the DPEs 104, and memory mapped switches, which are interconnected in the memory mapped network to memory mapped switches of the DPEs 104. Communications from DPEs 104 can be communicated with the tile 108 below the respective DPEs 104 via the interconnected stream switches and/or memory mapped switches. The tile 108 can provide an interface to the PL 110 and/or the NoC 116 for communicating therewith. The stream switches of the tiles 108 are also interconnected together in the stream network, and the memory mapped switches of the tiles 108 are interconnected together in the memory mapped network. Hence, communications can be propagated along the tiles 108 to a tile 108 that services a target DPE 104.

Generally, DPEs 104 and tiles 108 may be programmed by loading configuration data into configuration registers that define operations of the DPEs 104 and tiles 108. The configuration data may be programmed in the configuration registers by memory mapped transactions, such as through the memory mapped network.

Using a DPE array as described herein in combination with one or more other subsystems provides heterogeneous processing capabilities of the SoC 100. The SoC may have increased processing capabilities while keeping area usage and power consumption low. For example, the DPE array 102 may be used to hardware accelerate particular operations and/or to perform functions offloaded from one or more of the subsystems of the SoC 100. When used with a PS 112, for example, the DPE array 102 may be used as a hardware accelerator. The PS 112 may offload operations to be performed by the DPE array 102 or a portion thereof. In other examples, the DPE array 102 may be used to perform computationally resource intensive operations such as generating digital pre-distortion to be provided to analog/mixed signal circuitry.

Figure 2:
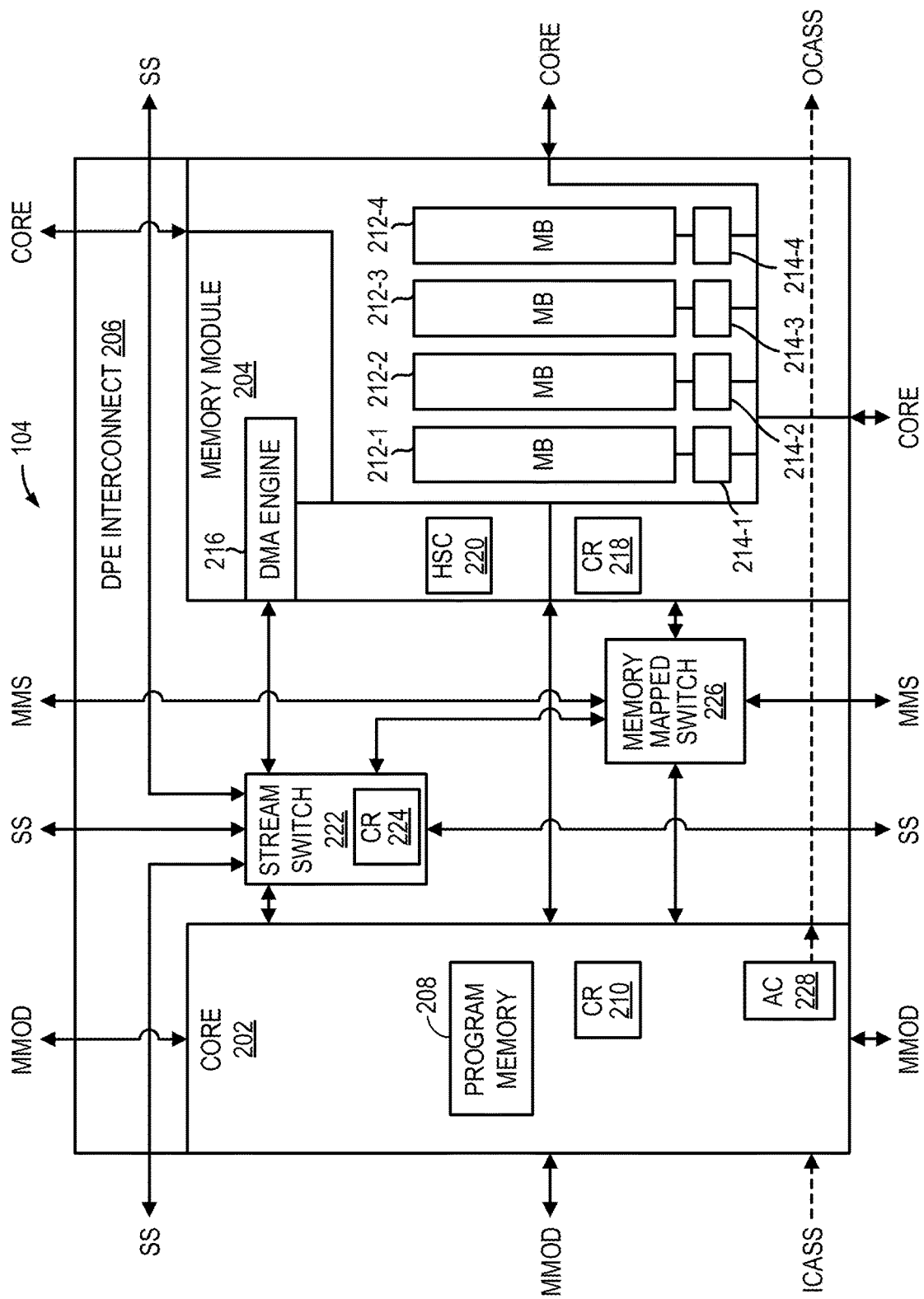
FIG. 2 depicts an architecture for a data processing engine (DPE) according to some examples.

FIG. 2 illustrates an architecture for a DPE 104 according to some examples. In the example of FIG. 2, DPE 104 includes a hardened core 202, a memory module 204, and DPE interconnect 206.

The core 202 provides data processing capabilities of the DPE 104. The core 202 may be implemented as any of a variety of different processing circuits. In some examples, the core 202 is implemented as a processor that is capable of executing program instruction code, e.g., computer readable program instruction code. Program memory 208 is included in the core 202 and is capable of storing program instruction code that is executed by the core 202. The core 202, for example, may be implemented as a CPU, a GPU, a DSP, a vector processor, or another type of processor that is capable of executing program instruction code. The core 202 may include configuration registers (CR) 210 that may be loaded with configuration data to control operation of core 202. In some examples, the core 202 may be activated and/or deactivated based upon configuration data loaded into the configuration registers 210.

The memory module 204 includes four memory banks 212-1, 212-2, 212-3, 212-4, although any number of memory banks may be implemented in the memory module 204. Each of the memory banks 212-1 to 212-4 can be readable and writeable memory, such as random-access memory (RAM). The memory banks 212-1 to 212-4 are capable of storing data that may be read and consumed by one or more core 202 and data (e.g., results) that may be written by one or more core 202. In some examples, each memory bank 212 is single-ported thereby allowing up to one access to each memory bank each clock cycle. In other examples, each memory bank 212 is dual-ported or multi-ported thereby allowing a larger number of parallel accesses each clock cycle. Each of memory banks 212-1, 212-2, 212-3, 212-4 has an arbiter 214-1, 214-2, 214-3, 214-4. Each arbiter 214 may include arbitration logic. Further, each arbiter 214 may include a crossbar.

The memory module 204 further includes DMA engine 216. In some examples, DMA engine 216 is capable of (i) receiving input data streams from the DPE interconnect 206 and writing the received data to memory banks 212, and (ii) reading data from memory banks 212 and sending the data out via the DPE interconnect 206, as described below. Through DMA engine 216, application data may be received from other sources (e.g., other subsystems or any DPE 104) within the SoC 100 and stored in the memory module 204. Through DMA engine 216, data may be read from the memory banks 212 of memory module 204 and sent to other destinations (e.g., other subsystems or any DPE 104). The memory module 204 may include configuration registers (CR) 218 that may be loaded with configuration data to control operation of the memory module 204. More specifically, the DMA engine 216 may be controlled by the configuration registers 218.

Memory module 204 further may include hardware synchronization circuitry (HSC) 220. In general, hardware synchronization circuitry 220 is capable of synchronizing operation of different requestors—e.g., different cores (e.g., cores of neighboring DPEs capable of directly accessing the memory module 204), core 202, DMA engine 216, and other external masters (e.g., the PS 112) that may communicate via the DPE interconnect 206. In some examples, the hardware synchronization circuitry 220 may include different locks, which number of locks may depend upon the number of entities able to access the memory module. In some examples, each different hardware lock may have an arbiter that is capable of handling simultaneous requests. Further, each hardware lock is capable of handling a new request each clock cycle. A requestor, for example, acquires a lock on a particular portion of memory in a memory module from the local hardware synchronization circuitry 220 prior to accessing the portion of memory. The requestor may release the lock so that another requestor may acquire the lock prior to accessing the same portion of memory. Hardware synchronization circuitry 220 can manage operation of the shared memory between DPEs by regulating and synchronizing access to the memory modules of the DPEs.

The DPE interconnect 206 in the DPE 104 facilitates communication with one or more other DPEs and/or with other subsystems of the SoC 100. The DPE interconnect 206 further enables communication of configuration and control data with the DPE 104. In some examples, the DPE interconnect 206 is implemented as an on-chip interconnect, such as an Advanced Microcontroller Bus Architecture (AMBA) eXtensible Interface (AXI) bus (e.g., or switch) and/or other interconnect circuitry.

The DPE interconnect 206 includes a stream network and a memory mapped network. The stream network is capable of exchanging data (e.g., application data) with other DPEs of DPE array 102 and/or other subsystems of the SoC 100. The memory mapped network is capable of exchanging data such as configuration and control data for the DPE(s).

The stream network of DPE interconnect 206 includes a stream switch 222 in each DPE 104, and stream switches 222 of DPEs are interconnected in forming the stream network. Although not specifically illustrated, each stream switch 222 includes stream interfaces, each of which is connected to another component (which may also have a stream interface) with which the stream switch 222 communicates. Each stream interface may include one or more masters (e.g., master interfaces or outputs) and/or one or more slaves (e.g., slave interfaces or inputs). Each master may be an independent output having a particular bit-width. For example, each master included in a stream interface may be an independent AXI master. Each slave may be an independent input having a particular bit-width. For example, each slave included in a stream interface may be an independent AXI slave.

The stream switch 222 is used to communicate with other DPEs and/or the SoC interface block 106. For example, the stream switch 222 can communicate with a stream switch (SS) in a DPE 104 or tile 108 in the SoC interface block 106 in each cardinal direction—e.g., to the left, above, right, and below. The stream switch 222 is capable of allowing non-neighboring DPEs to communicate with the core 202 and/or the memory module 204 via the stream network. The stream switch 222 can communicate with the core 202 (e.g., via a stream interface of the core 202) and the memory module 204 (e.g., via a stream interface of the memory module 204). The core 202 can therefore communicate with other DPEs 104 via the stream switch 222. The stream switch 222 can also communicate with the DMA engine 216 (e.g., via a stream interface of the DMA engine 216) of the memory module 204, which permits other DPEs 104 to communicate with the DMA engine 216. Cores of other DPEs may access the memory banks 212 of the memory module via the stream switch 222 (and stream network) and the DMA engine 216. The stream switch 222 may include configuration registers (CR) 224 to which configuration data may be written that can dictate which other DPEs and/or subsystems (e.g., the PL 110 and/or the PS 112) the DPE 104 can communicate with via the stream switch 222 and can dictate operation of the stream switch 222 (e.g., establishing circuit-switched point-to-point connections or packet-switched connections).

Stream interfaces of the stream switch 222 are capable of providing deterministic throughput with a guaranteed and fixed latency from source to destination. In some examples, each stream interface that communicates with the DPE 104 to the left or to the right is capable of receiving four 32-bit streams (e.g., four input channels) and outputting four 32-bit streams (e.g., four output channels). In some examples, the stream interface that communicates with the DPE 104 or tile 108 below (e.g., in the architecture of FIG. 1) is capable of receiving six 32-bit streams (e.g., six input channels) and outputting four 32-bit streams (e.g., four output channels). In some examples, the stream interface that communicates with the DPE above (e.g., in the architecture of FIG. 1) is capable of receiving four 32-bit streams (e.g., four input channels) and outputting six 32-bit streams (e.g., six output channels). The numbers of streams and sizes of the streams of each stream interface are provided for purposes of illustration.

In the circuit-switching mode, each channel of the stream switch 222 is capable of servicing one data flow (e.g., one net is capable of being routed through each channel). In the packet-switching mode, multiple data flows can share a channel of the stream switch 222 (e.g., multiple nets are capable of being routed through each channel). In some examples, a channel can be shared by four data flows in the packet-switching mode.

The memory mapped network of DPE interconnect 206 includes a memory mapped switch 226 in each DPE 104, and memory mapped switches 226 of DPEs are interconnected in forming the memory mapped network. Although not specifically illustrated, each memory mapped switch 226 includes memory mapped interfaces, each of which is connected to another component (which may also have a memory mapped interface) with which the memory mapped switch 226 communicates. In some examples, each memory mapped interface may include one or more masters (e.g., master interfaces or outputs) and/or one or more slaves (e.g., slave interfaces or inputs). Each master may be an independent output having a particular bit-width. For example, each master included in a memory mapped interface may be an independent AXI master. Each slave may be an independent input having a particular bit-width. For example, each slave included in a memory mapped interface may be an independent AXI slave.

The memory mapped switch 226 is used to exchange configuration and control data for the DPE 104. The memory mapped switch 226 is capable of receiving configuration data that is used to configure the DPE 104. The memory mapped switch 226 may receive configuration data from a memory mapped switch (MMS) of a DPE and/or a tile 108 located below DPE 104. The memory mapped switch 226 is capable of forwarding received configuration data to a memory mapped switch (MMS) of another DPE above DPE 104, to program memory 208 and/or configuration registers 210 within the core 202, to memory banks 212 and/or configuration registers 218 in the memory module 204, and/or to configuration registers 224 within the stream switch 222.

In some examples, the DPE array 102 is mapped to the address space of the PS 112. Accordingly, any configuration registers and/or memories within any DPE 104 may be accessed via the memory mapped network. For example, the program memory 208, the memory banks 212, and configuration registers 210, 218, 224 may be read and/or written via the memory mapped switch 226. Through the memory mapped network, subsystems of the SoC 100 are capable of reading an internal state of any configuration register 210, 218, 224, and are capable of writing configuration data to any configuration register 210, 218, 224. Through the memory mapped network, subsystems of the SoC 100 are capable of reading the program memory 208, and are capable of writing program instruction code to the program memory 208. Through the memory mapped network, subsystems of the SoC 100 are capable of reading data from and writing data to a memory bank 212 via the arbiters 214.

The memory module 204 includes memory interfaces, each of which is capable of communicating with a core (CORE) neighboring the memory module 204. Hence, the memory module 204 is capable of operating as a shared memory that may be accessed by multiple DPEs. In the orientation of the example of FIG. 2, cores 202 of the illustrated DPE 104 and DPEs 104 above, to the right, and below the illustrated DPE 104 (e.g., cores that share a boundary with the memory module 204) can access the memory banks 212 through arbiters 214. Accordingly, in the example of FIG. 2, each core 202 or DPE 104 that has a shared boundary with the memory module 204 is capable of reading and writing to memory banks 212. If the orientation of the DPE 104 differs, orientations of cores that are capable of accessing the memory module 204 can differ.

The core 202 is capable of communicating with a memory module (MMOD) neighboring the core 202, and hence, is capable of accessing memory modules of other neighboring DPEs. In the orientation of the example of FIG. 2, the core 202 of the illustrated DPE 104 can access the memory modules of the illustrated DPE 104 and DPEs 104 above, to the left, and below the illustrated DPE 104 (e.g., memory modules that share a boundary with the core 202). Accordingly, in the example of FIG. 2, the core 202 is capable of reading and writing to any of the memory modules of DPEs that share a boundary with the core 202. The core 202 is capable of directing the read and/or write requests to the appropriate memory module based upon the addresses that are generated. If the orientation of the DPE 104 differs, orientations of memory modules that are capable of being accessed the core 202 can differ.

Figure 3:
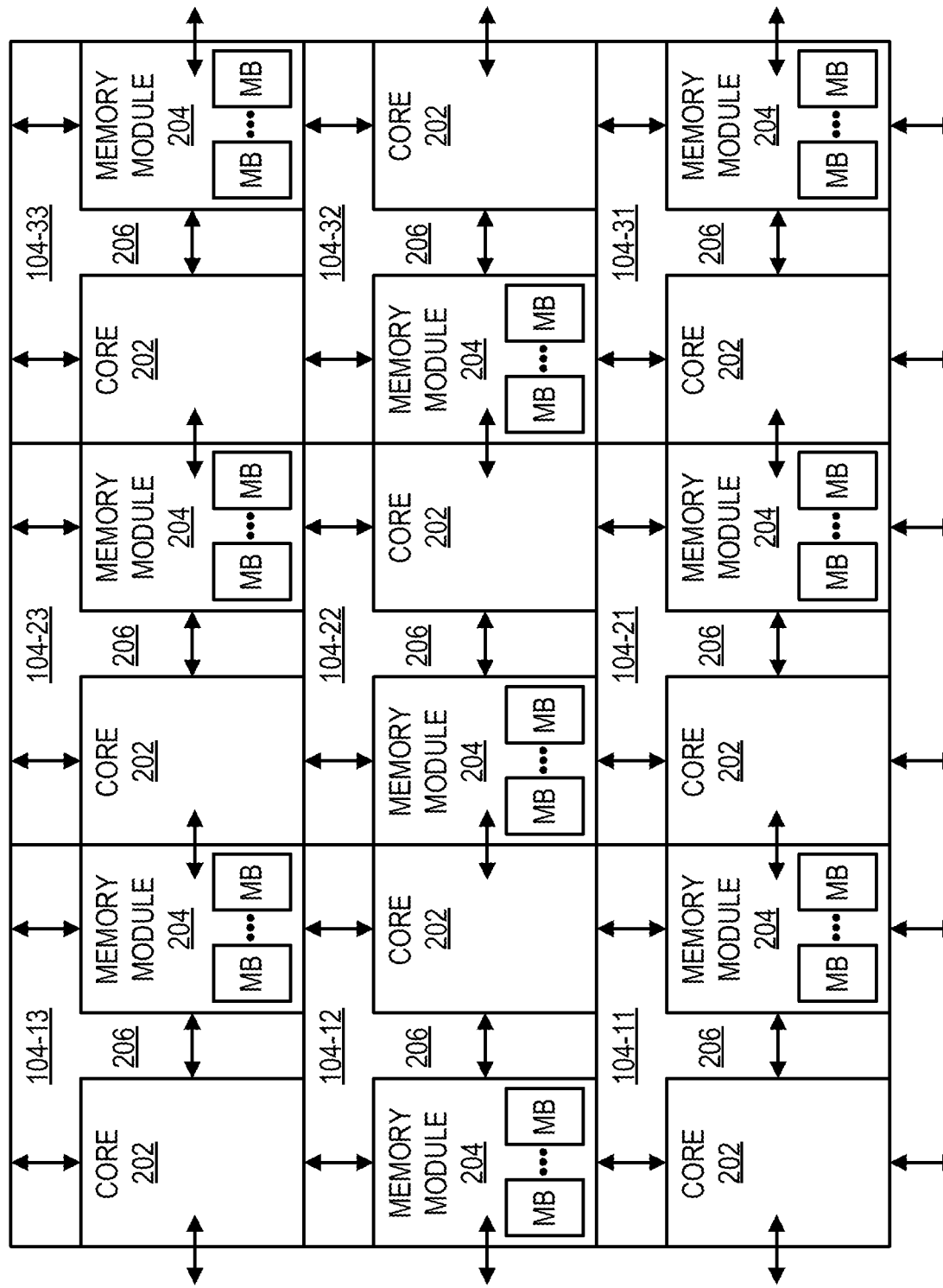
FIG. 3 depicts a plurality of DPEs in a portion of a DPE array according to some examples.

FIG. 3 illustrates a plurality of DPEs 104 in a portion of the DPE array 102 according to some examples. FIG. 3 illustrates aspects of sharing memory by DPEs 104. For example, cores 202 in DPEs 104-12, 104-22, 104-21, 104-23 are capable of accessing and sharing memory banks 212 in memory module 204 of DPE 104-22. Similarly, core 202 of DPE 104-22 is capable of accessing memory banks 212 in memory modules 204 of DPEs 104-22, 104-32, 104-21, 104-23. Other cores can similarly access and share other memory banks.

Referring back to FIG. 2, the core 202 may also include cascade interfaces, each of which is capable of providing direct communication with another core. The core 202 receives an input data stream (ICASS) directly from the core of the DPE to the left of the illustrated DPE 104. The received data stream may be provided to the data processing circuitry within core 202. The core 202 is capable of sending an output data stream (OCASS) directly to the core of the DPE to the right of the illustrated DPE 104. Each cascade interface may include a first-in-first-out (FIFO) interface for buffering. A cascade interface is capable of outputting to another core the contents of an accumulator register (AC) 228 in the core 202 and may do so each clock cycle. Accumulator register 228 may store data that is generated and/or being operated upon by data processing circuitry within core 202. The cascade interfaces may be programmed based upon configuration data loaded into the configuration registers 210 (e.g., activated or deactivated). In some other examples, the cascade interfaces are controlled by the core 202. For example, the core 202 may include program instruction code to read/write to the cascade interface(s).

The hardware synchronization circuitry 220 may be accessed via the memory mapped switch 226 of the memory mapped network. In some examples, a lock transaction is implemented as an atomic acquire (e.g., test if unlock and set lock) and release (e.g., unset lock) operation for a resource. Locks of the hardware synchronization circuitry 220 provide a way to efficiently transfer ownership of a resource between two participants. The resource can be any of a variety of circuit components such as a buffer in local memory (e.g., a buffer in the memory module 204).

The hardware synchronization circuitry 220 is also capable of synchronizing any of a variety of other resources and/or agents, including other DPEs and/or other cores. For example, since the hardware synchronization circuitry 220 provides a shared pool of locks, the locks may be used by a DPE, e.g., a core of a DPE, to start and/or stop operation of another DPE or core. The locks of hardware synchronization circuitry 220 may be allocated, e.g., based upon configuration data, for different purposes such as synchronizing different agents and/or resources as may be required depending upon the particular application(s) implemented by DPE array 102. In some examples, DPE access and DMA access to the locks of hardware synchronization circuitry 220 are blocking. Such accesses are capable of stalling the requesting core or the DMA engine in cases where a lock cannot be immediately acquired. Once the hardware lock becomes available, the core or DMA engine acquires the lock and un-stalls automatically.

In some examples, memory mapped accesses may be non-blocking such that a memory mapped master is capable of polling the status of the locks of the hardware synchronization circuitry 220. For example, a memory mapped switch can send a lock "acquire" request as a normal memory read operation to the hardware synchronization circuitry 220. The read address may encode the identifier of the lock and other request data. The read data, e.g., response to the read request, may signal the success of the acquire request operation. The "acquire" sent as a memory read may be sent in a loop until successful. In another example, the hardware synchronization circuitry 220 can issue an event such that the memory mapped master receives an interrupt when the status of the requested lock changes.

Figure 4:
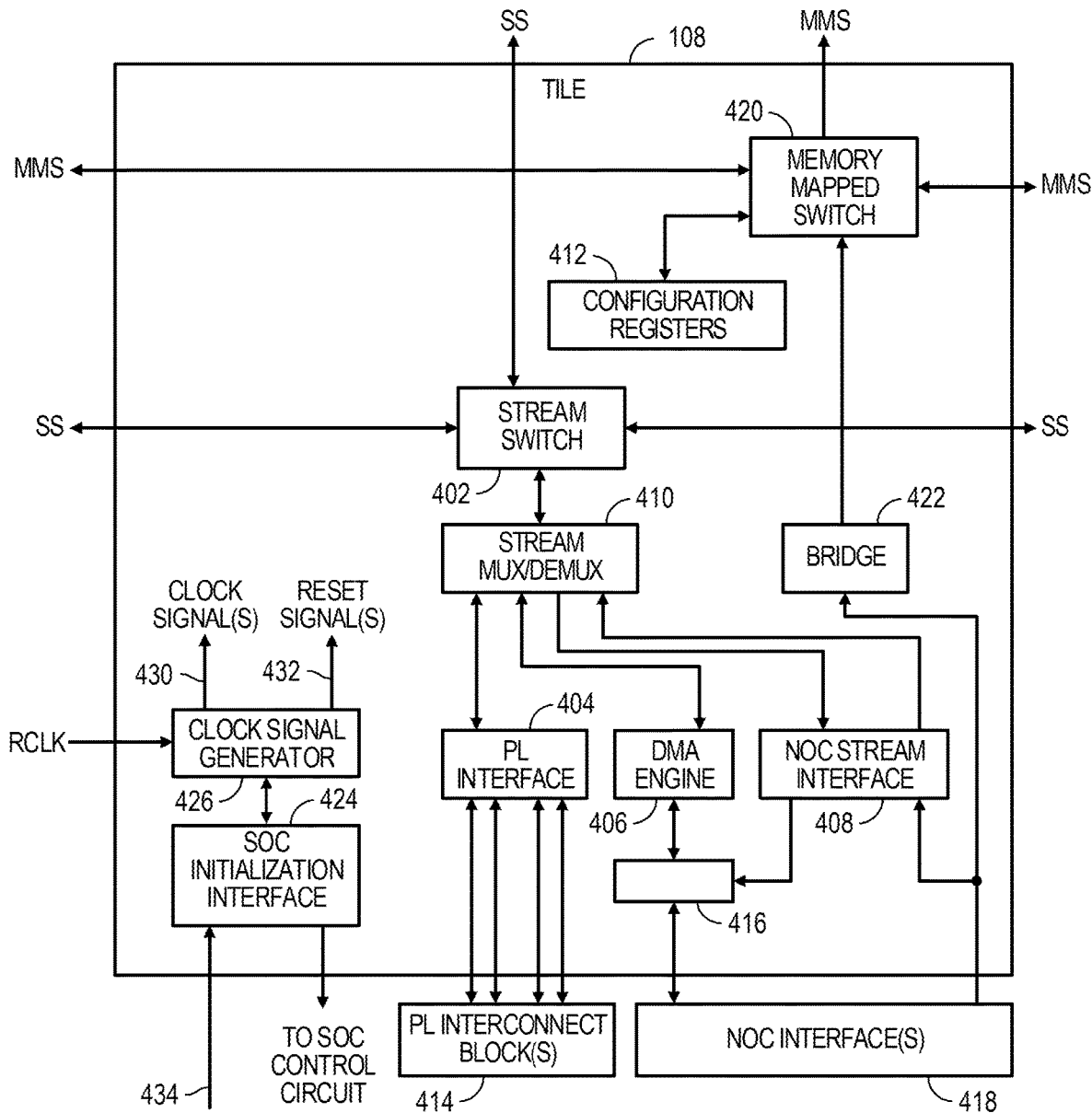
FIG. 4 depicts an architecture for a tile of a SoC interface block according to some examples.

FIG. 4 illustrates an example architecture for a tile 108 of the SoC interface block 106 according to some examples. In other implementations of a tile 108, a tile 108 may include additional or less circuitry and/or functionality. The tile 108 includes a stream switch 402 that includes stream interfaces (not specifically illustrated), each of which is connected to another component (which may also have a stream interface) with which the stream switch 402 communicates. Each stream interface may include one or more masters (e.g., master interfaces or outputs) and/or one or more slaves (e.g., slave interfaces or inputs). Each master may be an independent output having a particular bit-width. For example, each master included in a stream interface may be an independent AXI master. Each slave may be an independent input having a particular bit-width. For example, each slave included in a stream interface may be an independent AXI slave.

Stream switch 402 is connected horizontally to respective stream switches (SS) in neighboring tiles 108 and vertically to a stream switch (SS) in a neighboring DPE 104 to connect to and further form the stream network of the DPE array 102. Stream switches in neighboring tiles 108 are capable of exchanging data horizontally. The stream switch 402 is capable of communicating with the DPE 104 immediately above the tile 108. The stream switch 402 is also connected to and may communicate with a PL interface 404, a DMA engine 406, and/or to a NoC stream interface 408 via a stream multiplexer/demultiplexer (stream mux/demux) 410.

The stream switch 402 is configurable by configuration data loaded into configuration registers 412. The stream switch 402, for example, may be configured to support packet-switched and/or circuit-switched operation based upon the configuration data. Further, the configuration data defines the particular DPE and/or DPEs within DPE array 102 to which stream switch 402 communicates.

The stream multiplexer/demultiplexer 410 is capable of directing data received from the PL interface 404, DMA engine 406, and/or NoC stream interface 408 to the stream switch 402. Similarly, the stream multiplexer/demultiplexer 410 is capable of directing data received from the stream switch 402 to the PL interface 404, DMA engine 406, and/or to NoC stream interface 408. The stream multiplexer/demultiplexer 410 may be programmed by configuration data stored in the configuration registers 412 to route selected data to the PL interface 404, to the DMA engine 406 where such data is sent over the NoC 116 as memory mapped transactions, and/or to the NoC stream interface 408 where the data is sent over the NoC 116 as a data stream.

The PL interface 404 couples to the PL 110 of the SoC 100 and provides an interface thereto. The PL interface 404 couples directly to one or more PL interconnect blocks 414 (e.g., programmable interconnect elements and/or boundary logic interfaces (BLIs)) in the PL 110. In some examples, the PL interface 404 is further coupled to other types of circuit blocks and/or subsystems to be capable of transferring data between tile 108 and such other subsystems and/or blocks. In some examples, the PL interface 404 includes eight input channels and six output channels, although other numbers of input and output channels may be implemented.

The DMA engine 406 is capable of operating to direct data into the NoC 116 through a selector block 416 and on to a NoC interface(s) 418. The DMA engine 406 is capable of receiving data from DPEs (via the stream network) and providing such data to the NoC 116 as memory mapped transactions. In some examples, DMA engine 406 includes hardware synchronization circuitry that may be used to synchronize multiple channels included in the DMA engine 406 and/or a channel within the DMA engine 406 with a master that polls and drives the lock requests. For example, the master may be the PS 112 or a device implemented within the PL 110. The master may also receive an interrupt generated by the hardware synchronization circuitry within the DMA engine 406.

In some examples, the DMA engine 406 is capable of accessing an external memory. For example, DMA engine 406 is capable of receiving data streams from DPEs and sending the data stream to external memory through the NoC 116 to a memory controller located within the SoC 100. The memory controller then directs the data received as data streams to the external memory (e.g., initiates reads and/or writes of the external memory as requested by DMA engine 406). Similarly, DMA engine 406 is capable of receiving data from external memory where the data may be distributed to other tile(s) 108 of SoC interface block 106 and/or up into target DPEs 104.

The NoC stream interface 408 is capable of receiving data from the NoC 116 via the NoC interface(s) 418 and forwarding the data to the stream multiplexer/demultiplexer 410. The NoC stream interface 408 is further capable of receiving data from stream multiplexer/demultiplexer 410 and forwarding the data to NoC interface 418 through the selector block 416. The selector block 416 is configurable to pass data from the DMA engine 406 or from NoC stream interface 408 on to NoC interface(s) 418.

In some examples, each stream interface that communicates with the tile 108 to the left or to the right is capable of receiving four 32-bit streams (e.g., four input channels) and outputting four 32-bit streams (e.g., four output channels). In some examples, the stream interface that communicates with the DPE 104 above (e.g., in the architecture of FIG. 1) is capable of receiving four 32-bit streams (e.g., four input channels) and outputting six 32-bit streams (e.g., six output channels). In some examples, the stream interface that communicates with the PL interface 404, DMA engine 406, and NoC stream interface 408 is capable of receiving eight 32-bit streams (e.g., eight input channels) and outputting six 32-bit streams (e.g., six output channels). The numbers of streams and sizes of the streams of each stream interface are provided for purposes of illustration.

The tile 108 includes a memory mapped switch 420 that includes memory mapped interfaces, each of which is connected to another component (which may also have a memory mapped interface) with which the memory mapped switch 420 communicates. The memory mapped switch 420 connects vertically to the memory mapped switch (MMS) of the DPE immediately above, which permits, for example, the memory mapped switch 420 to be capable of communicating with the column of DPEs above the tile 108 and to further form the memory mapped network of the DPE array 102. The memory mapped switch 420 connects horizontally to memory mapped switches (MMS) in neighboring tiles 108, which permits, for example, the memory mapped switch 420 to be capable of moving data (e.g., configuration and control data) from one tile to another to reach a correct column of DPEs and direct the data to the target DPE within the column. The memory mapped switch 420 may also connect to configuration registers 412 within tile 108. Through memory mapped switch 420, configuration data may be loaded into configuration registers 412 to control various functions and operations performed by components within tile 108. The memory mapped switch 420 is coupled to NoC interface(s) 418 via bridge 422. The bridge 422 is capable of converting memory mapped data transfers from the NoC 116 (e.g., configuration and control data) into memory mapped data that may be received by memory mapped switch 420. Accordingly, the PS 112 or any other subsystem or circuit block can communicate with, e.g., a core 202 or memory module 204 (including hardware synchronization circuitry 220) of any DPE 104 via the memory mapped network of the DPE array 102.

The tile 108 can include a SoC initialization interface 424 and a clock signal generator 426. In some examples, the SoC initialization interface 424 is implemented as a NoC peripheral interconnect endpoint circuit. The SoC initialization interface 424 is capable of providing access to global reset registers for DPE array 102 (not shown) and to configuration registers (e.g., for clock signal generator 426).

The clock signal generator 426 is capable of generating one or more clock signal(s) 430 and/or one or more reset signal 432. The clock signal(s) 430 and/or reset signals 432 may be distributed to each of the DPEs 104 and/or to other tiles 108 of the SoC interface block 106. In some examples, the clock signal generator 426 may include one or more phase lock loop circuits (PLLs). As illustrated, the clock signal generator 426 is capable of receiving a reference clock signal (RCLK) generated by another circuit external to the DPE array 102 and located on the SoC 100. The clock signal generator 426 is capable of generating the clock signal(s) 430 based upon the received reference clock signal. The clock signal generator 426 is configured through the SoC initialization interface 424. For example, the clock signal generator 426 may be configured by loading data into configuration registers (not illustrated). As such, the clock frequency or clock frequencies of DPE array 102 and the generation of reset signals 432 may be set by writing appropriate configuration data to the configuration registers through the SoC initialization interface 424.

The SoC initialization interface 424 may be coupled to a SoC control circuit (e.g., a control subsystem of the SoC 100 not shown). In some examples, the SoC initialization interface 424 is capable of providing status signals to the SoC control circuit. As an example, the SoC initialization interface 424 is capable of providing a "PLL lock" signal generated from inside of clock signal generator 426 to the SoC control circuit. The PLL lock signal may indicate when the PLL acquires lock on the reference clock signal. The SoC initialization interface 424 is capable of receiving instructions and/or data via an interface 434. The data may include clock signal generator configuration data, and/or other data that may be written to configuration registers.

Applications (e.g., a user design) can be designed, compiled, and instantiated on the SoC 100 based on the architecture described above or on other ICs based on other architectures. The applications can be compiled according to some examples.

Figure 5:
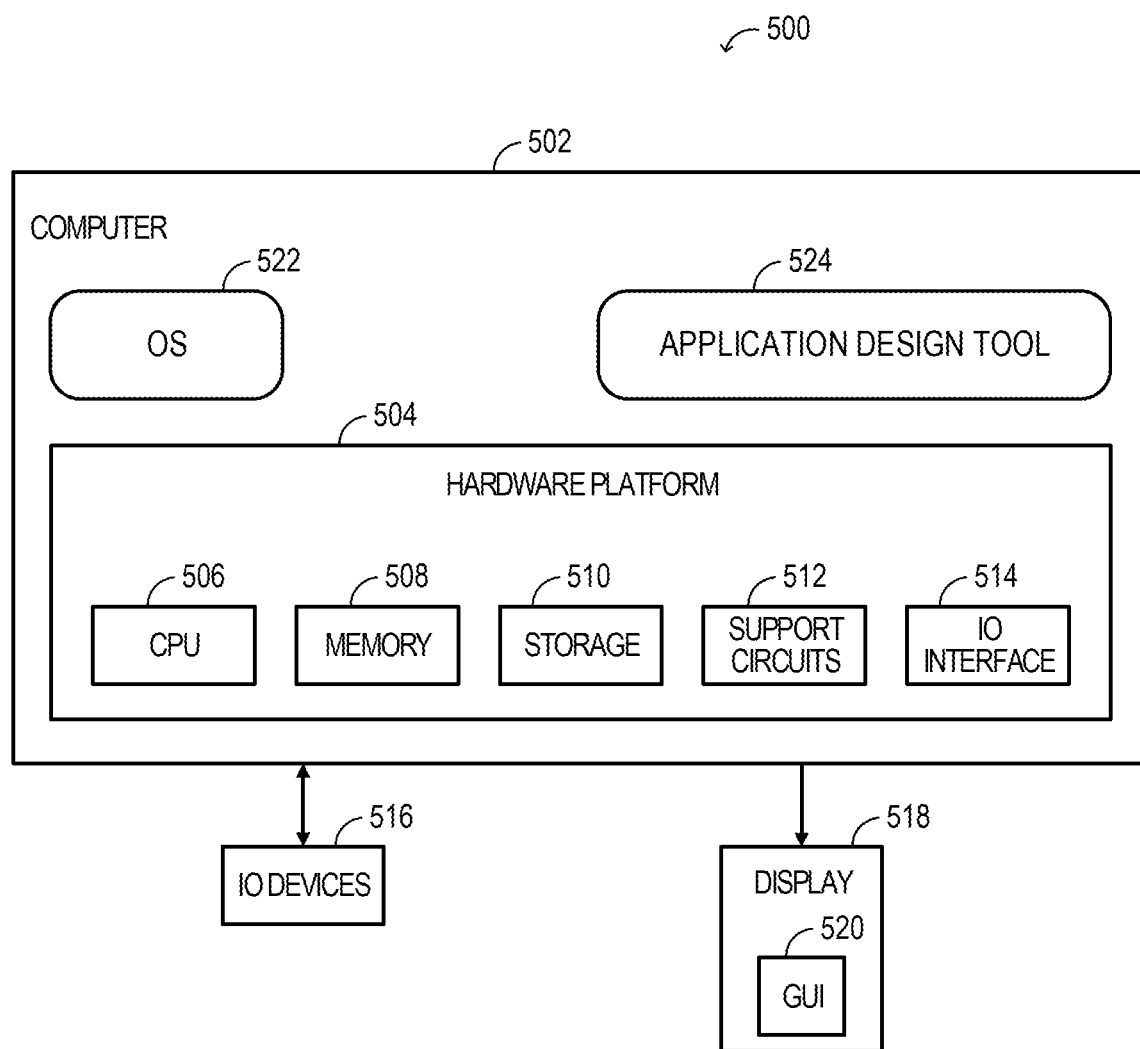
FIG. 5 is a block diagram depicting an example of an application design system in accordance with some examples.

FIG. 5 is a block diagram depicting an example of an application design system 500, in accordance with some examples. The application design system 500 (e.g., a processor-based system) can be used by a user to create an application that can be compiled to generate a boot image file that can be loaded on the SoC 100 of FIG. 1, for example. The application design system 500 includes a computer 502 coupled to input/output (IO) devices 516 and a display 518. The computer 502 includes a hardware platform 504 that can include components of a computing device, such as a central processing unit (CPU) 506, system memory 508, storage 510, various support circuits 512, and an IO interface 514. The CPU 506 can include one or more microprocessors. The CPU 506 is configured to execute program instruction code that performs one or more operations described herein. The program instruction code can be stored in system memory 508, storage 510, or any other memory in the hardware platform 504 (e.g., cache memory). The system memory 508 includes one or more non-transitory storage mediums that store information and can include, for example, random access memory (RAM), read-only memory (ROM), or a combination thereof. The storage 510 includes one or more local non-transitory storage mediums, such as hard disks, flash memory modules, solid state disks, optical disks, and the like. The storage 510 can also include interface(s) configured for communication with one or more network data storage systems. The support circuits 512 can include cache, power supplies, clock circuits, data registers, IO interfaces, and the like. The IO interface 514 includes interfaces to/from the computer 502. The IO interface 514 can be coupled to the IO devices 516, which can include a keyboard, mouse, and the like. The IO interface 514 can also be coupled to the display 518, which can present a graphical user interface (GUI) 520 to a user.

The computer 502 further includes a software platform comprising an operating system (OS) 522 and an application design tool 524. The OS 522 and the application design tool 524 include program instruction code that is executed by the CPU 506, which program instruction code can be stored in system memory 508, storage 510, or any other memory. The OS 522 can include any known operating system, such as Linux®, Microsoft Windows®, Mac OS®, and the like. The application design tool 524 is an application that executes within the OS 522, which provides an interface to the hardware platform 504. Some operation of the application design tool 524 is described below.

Figure 6:
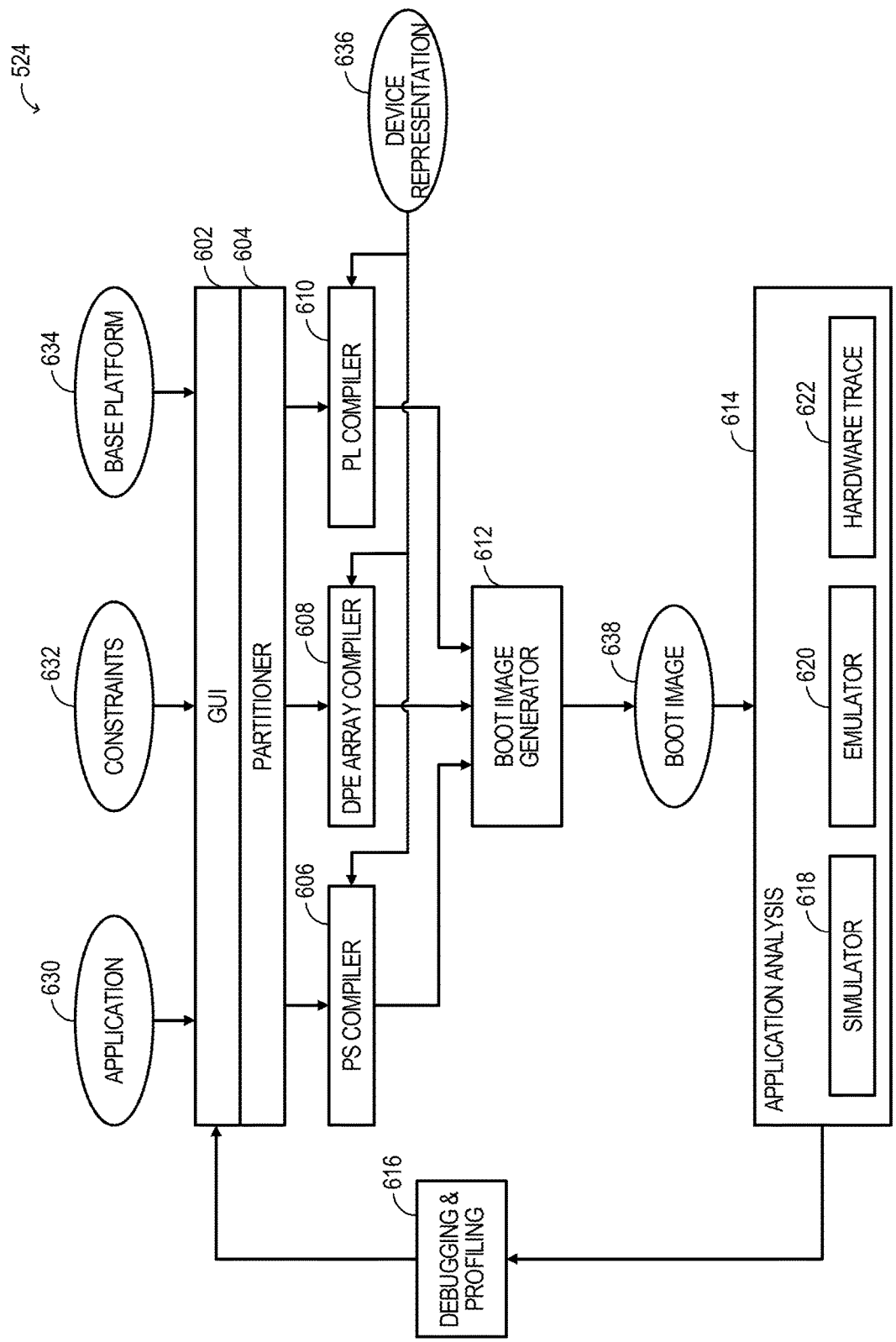
FIG. 6 is a block diagram depicting an application design tool capable of being implemented on the application design system of FIG. 5 according to some examples.

FIG. 6 is a block diagram depicting an application design tool 524 capable of being implemented on the application design system 500 of FIG. 5 according to some examples. The application design tool 524 includes a GUI module 602, a partitioner module 604, a PS compiler module 606, a DPE array compiler module 608, a PL compiler module 610, a boot image generator module 612, an application analysis module 614, and a debugging and profiling module 616. The application analysis module 614 includes a simulator module 618, an emulator module 620, and a hardware trace module 622. The modules 602-622 are just an example implementation of the application design tool 524. The functions performed by the modules 602-622 described herein can be performed by a different configuration of one or more modules in the application design tool 524. The modules 602-622 in the application design tool 524 can be implemented by circuitry that is part of the application design system 500, by firmware and/or software in the application design system 500, or by a combination thereof.

The GUI module 602 provides an interface, via the GUI 520 and IO devices 516, for example, for a user to create an application 630 (e.g., a user design). The application 630 can be a file including source code that defines the functionality of the application 630. The application 630 can be implemented according to a graph programming model. The application 630 can include kernel source code that defines kernels, and can define edges (e.g., data flows) that link the kernels. The application 630 can be written in various types of object orientated programming languages (e.g., C++ or another language). An advantage of implementing a graph programming model for the application 630 is that a graph can have a highly parallelized architecture. In some examples, the semantics of the graph established by the application 630 is based upon the general theory of Kahn Process Networks which provides a computation model for deterministic parallel computation that is applied to the heterogeneous architecture in the SoC 100 (which includes different programmable architectures, e.g., the DPE array 102, the PS 112, and/or the PL 110).

Some constraints of the constraints file 632 can also be defined via the GUI module 602. The constraints can be user-defined, such as performance constraints and placement constraints, or pre-defined system constraints, such as constraints of the architecture like permissible number of data flows through a channel of a stream switch based on a mode, etc. User-defined constraints can be defined via the GUI module 602, for example. The constraints of the constraints file 632 can restrict some functionality to be performed within a defined latency, can restrict where various kernels can be placed in relation to another kernel, can restrict in which subsystem (e.g., the DPE array 102, the PS 112, or the PL 110) functionality can be mapped, etc., for example.

A base platform 634 can be a pre-defined class library that defines various functions, application programming interfaces (APIs), etc. that can be used by the application 630 via the GUI module 602. The application 630 (e.g., graph) can use various objects defined in the class library to call functionality in the application 630.

After creating the application 630, the application 630, constraints file 632, and base platform 634 are passed to the partitioner module 604. The partitioner module 604 partitions functionality of the application 630 to the different subsystems (e.g., the DPE array 102, the PS 112, or the PL 110). The partitioner module 604 can parse the application, e.g., based on the objects that are used to define different functions of the application 630 to partition the application 630 to the different subsystems. The partitioned functionality can be in separate netlists, with each netlist corresponding to an appropriate compiler module 606-610.

The partitioned functionality (e.g., netlists) is passed to the PS compiler module 606, the DPE array compiler module 608, and the PL compiler module 610. In some examples, a compiler module may not be passed partitioned functionality if the application 630 does not include functionality to be mapped to the corresponding subsystem. The PS compiler module 606 compiles the functionality partitioned to the PS 112 and generates binaries from the compiling. The DPE array compiler module 608 compiles the functionality partitioned to the DPE array 102 (e.g., including mapping and routing) and generates binaries from the compiling. The PL compiler module 610 compiles the functionality partitioned to the PL 110 (e.g., including placing and routing) and generates a bitstream from the compiling. The compiling by any of the PS compiler module 606, the DPE array compiler module 608, and the PL compiler module 610 can be based on a device representation file 636 that is a logical representation of the architecture of the SoC 100, e.g., such that various functionality can be mapped or placed on components of a given subsystem. The compiling by any of the PS compiler module 606, the DPE array compiler module 608, and the PL compiler module 610 can be iteratively performed based on the compiling of any other of the PS compiler module 606, the DPE array compiler module 608, and the PL compiler module 610. For example, to meet some constraints, mapped functionality within the DPE array 102 may be re-mapped based on the placement of logic within the PL 110 to meet timing constraints between the DPE array 102 and the PL 110.

The boot image generator module 612 assembles the binaries and bitstream from the compiler modules 606-610 in a boot image file 638. The boot image file 638 is assembled in a format that is capable of being read, loaded, and executed on the SoC 100. The boot image file 638 is capable of being read, loaded, and executed on, e.g., the SoC 100 to implement the application 630 on the SoC 100. The boot image file 638 can be stored in any of the system memory 508 and the storage 510 of the application design system 500 after being assembled, for example. Subsequently, the boot image file 638 can be loaded into another non-transitory storage medium, such as flash memory on a same board as the SoC 100 for loading onto the SoC 100.

The application analysis module 614 is then capable of determining performance indicators of the boot image file 638 operating on the SoC 100. The simulator module 618 simulates the operation of the boot image file 638 on the SoC 100, and the emulator module 620 emulates the operation of the boot image file 638 on the SoC 100. The simulator module 618 can be a SystemC simulator, for example. The hardware trace module 622 is capable of, when communicatively coupled to the SoC 100, receiving trace information from the SoC 100 after the boot image file 638 has been loaded on the SoC 100 and the SoC 100 has performed operations according to the boot image file 638.

Results of the application analysis module 614 are passed to the debugging and profiling module 616. The debugging and profiling module 616 can parse the results from the application analysis module 614 and display, via the GUI module 602, various events and performance metrics indicated by the results. The user can view the events and performance metrics via the GUI module 602 and GUI 520 on the display 518, for example, and can responsively and iteratively modify the application 630.

Figure 7:
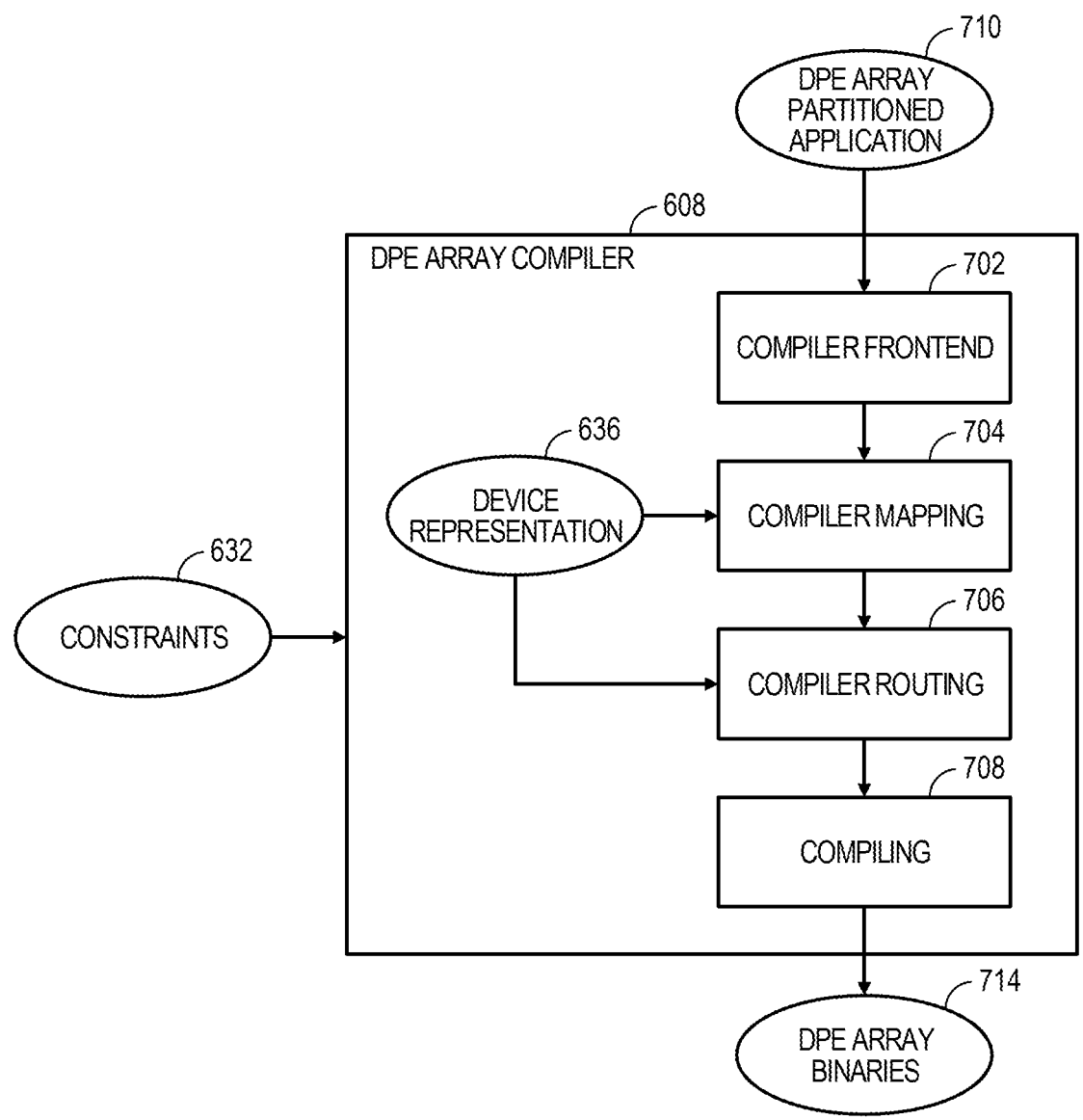
FIG. 7 is a block diagram depicting a DPE array compiler module of FIG. 6 according to some examples.

FIG. 7 is a block diagram depicting the DPE array compiler module 608 of FIG. 6 according to some examples. The DPE array compiler module 608 includes a compiler frontend module 702, a compiler mapping module 704, a compiler routing module 706, and a compiling module 708.

The DPE array compiler module 608 receives a DPE array partitioned application file 710 (e.g., a netlist) that includes kernels to be mapped to and instantiated on the DPE array 102. The DPE array partitioned application file 710 can be generated by the partitioner module 604 that partitions functionality of the application 630 to the different subsystems. The compiler frontend module 702 pre-processes the DPE array partitioned application file 710. For example, the processing can include identifying kernels that are to be mapped on different cores 202 of DPEs 104 and defining nets for edges between the kernels. The compiler frontend module 702 can generate a graph file (e.g., in a .json format) of the kernels and edges.

The compiler mapping module 704 maps kernels to cores 202 of DPEs 104 and maps input/output nodes of the DPE array 102 to tiles 108 of the SoC interface block 106. The compiler mapping module 704 uses the device representation file 636. Mapping by the compiler mapping module 704 identifies which elements in the device representation file 636 corresponding to the DPE array 102 will implement which kernels or other functionality. The compiler mapping module 704 may use the constraints file 632 to ensure that where kernels and input/output nodes are mapped comply with constraints identified in the constraints file 632.

Mapping kernels to cores 202 can include minimizing data movements such as by mapping the kernels to cores 202 that permit communication via shared memory in a memory module 204 between the cores 202. When communication via shared memory is permitted, mapping can also map buffers to memory banks in a memory module 204 for shared memory communications. In some examples where a group of kernels are repeated in an application (e.g., in the graph file), mapping can identify a cluster of kernels and map that cluster onto cores 202 of DPEs 104. The mapping of the cluster of kernels can then be replicated to cores 202 of other DPEs 104 to map the kernels of the application. Mapping of input/output nodes to tiles 108 can include an iterative process communicating with the PL compiler module 610 and/or PS compiler module 606. For example, where input/output nodes are to be mapped to tiles 108 may correspond to a location where logic is placed and routed within the PL 110. Hence, coordination between the DPE array compiler module 608 and PL compiler module 610 may occur when placing logic in the PL 110 and/or mapping input/output nodes to tiles 108 of the SoC interface block 106 of the DPE array 102.

The compiler mapping module 704 creates a mapped array file having kernels mapped to various cores 202 of DPEs 104 and input/output nodes mapped to various tiles 108, and can create a netlist of nets for edges between the kernels and/or input/output nodes. The mapped array file and netlist are output by the compiler mapping module 704 to the compiler routing module 706.

The compiler routing module 706 generates routes for nets (e.g., for edges) through the stream network of the DPE array 102, including through stream switches 222 of DPEs 104 and stream switches 402 of tiles 108. The compiler routing module 706 uses the device representation file 636 in generating the routes. The routing can be for streaming data flows of application data, for streaming DMAs between DPEs 104, or for other streaming data flows. The routes can be between various different cores 202 on which kernels are mapped, between various cores 202 on which kernels are mapped and memory modules 204 in different DPEs 104 (e.g., for streaming DMAs), between cores 202 on which kernels are mapped and mapped input/output nodes of tiles 108, and/or between other elements in the DPE array 102. The compiler routing module 706 may use the constraints file 632 to ensure that routes comply with constraints identified in the constraints file 632. Routing by the compiler routing module 706 and mapping by the compiler mapping module 704 may be iteratively performed to optimize a solution and/or to ensure compliance with constraints of the constraints file 632. The compiler routing module 706 generates a translated netlist that includes the generated routes.

The compiling module 708 generates an executable DPE array binaries file 714 based on the processing by the compiler frontend module 702, the mapping by the compiler mapping module 704, and the routing by the compiler routing module 706. For example, the compiling module 708 may use the graph file, the mapped array file, and the translated netlist to compile binaries that are stored in the executable DPE array binaries file 714. The executable DPE array binaries file 714 is capable of being loaded into the DPE array 102 and executed by DPEs 104 and tiles 108 in the DPE array 102. The executable DPE array binaries file 714 can be used to form the boot image file 638 of FIG. 6.

Figure 8:
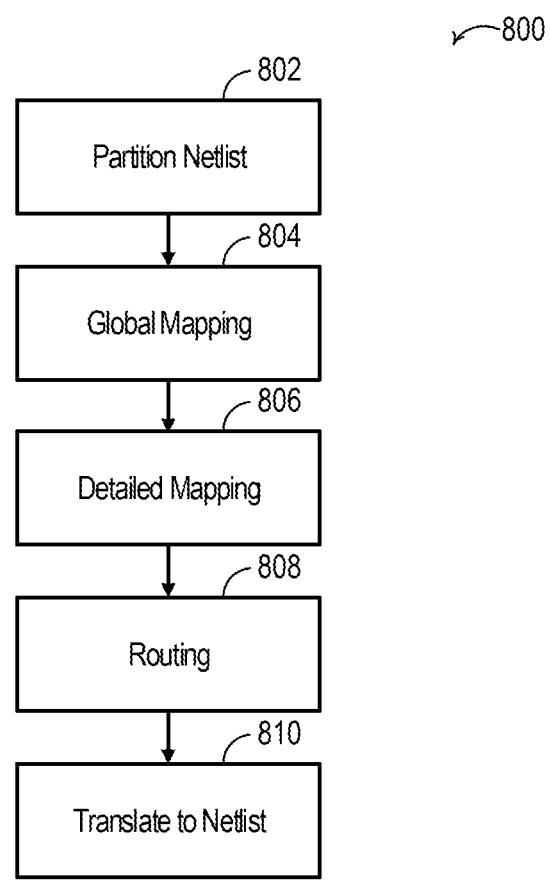
FIG. 8 is a flowchart of a method for compiling partitioned functionality of an application for a DPE array according to some examples.

FIG. 8 is a flowchart of a method 800 for compiling partitioned functionality of an application for a DPE array according to some examples. The method 800 may be performed by the DPE array compiler module 608 of FIG. 6, and any of the modules 702-708 of the DPE array compiler module 608 in FIG. 7 can perform one or more of the operations of the method 800.

In block 802, a netlist is partitioned into clusters. The netlist can be a netlist of the DPE partitioned application file 710 generated from the application 630 by the partitioner module 604 and passed to the DPE array compiler module 608. As described in further detail below, the netlist is partitioned into clusters of kernels. The partitioning of the netlist in block 802 may be performed by the compiler frontend module 702 or another module.

In block 804, global mapping is performed. The global mapping can map kernels (e.g., clusters of kernels in the partitioned netlist) to cores 202 of DPEs 104, input/output nodes to tiles 108 of the DPE array 102, control blocks to configuration registers 224, 412 in stream switches 222, 402 of DPEs 104 and tiles 108, and buffers to memory modules 204 of DPEs 104. The global mapping can be based on multiple considerations. For example, the global mapping may attempt to reduce communications by DMA, to reduce buffer conflicts, and/or to reduce wirelengths of routes. Additional details of some examples are described below. The global routing in block 804 may be performed by the compiler mapping module 704 or another module.

In block 806, detailed mapping is performed. Detailed mapping can include mapping buffers in specified memory banks 212 in the memory module 204 of the DPE 104 designated by the global mapping, and can include mapping inputs/outputs to specified channels of the stream switch 402 in the tile 108 designated by the global mapping for input/output interfaces of the DPE array 102. Additional details of some examples are described below. The detailed mapping in block 806 may be performed by the compiler mapping module 704 or another module.

In block 808, routing is performed. The routing can generate routes for streaming data in the stream network, such as for DMAs and other streaming data. The routing can include a global routing that identifies through which stream switches 222, 402 of DPEs 104 or tiles 108 the routes are formed, and a detailed routing that identifies the channels in the stream switches 222, 402 that forms the route. The routing, e.g., global and/or detailed routing, can include using a Boolean satisfiability problem (SAT) algorithm, an ILP algorithm, a PathFinder algorithm, a greedy algorithm, and/or the like. The routing in block 808 may be performed by the compiler routing module 706 or another module.

In block 810, the mapped elements and routes are translated to a netlist. The netlist can then be used for compiling, e.g., by the compiling module 708, of the DPE partitioned application file 710 to generate the executable DPE array binaries file 714.

Netlist Partitioning

The partitioner module 604 is configured to divide the placement problem into smaller sub-problems and to provide a floorplaning solution for downstream modules in the toolchain. Otherwise, the tools may take an unreasonable amount of time to achieve the same or better quality solution. The objective of partitioning is to minimize the chance of having to insert DMAs for memory connections between circuit components and to generate a compact placement (e.g., minimize wirelength).

Figure 9:
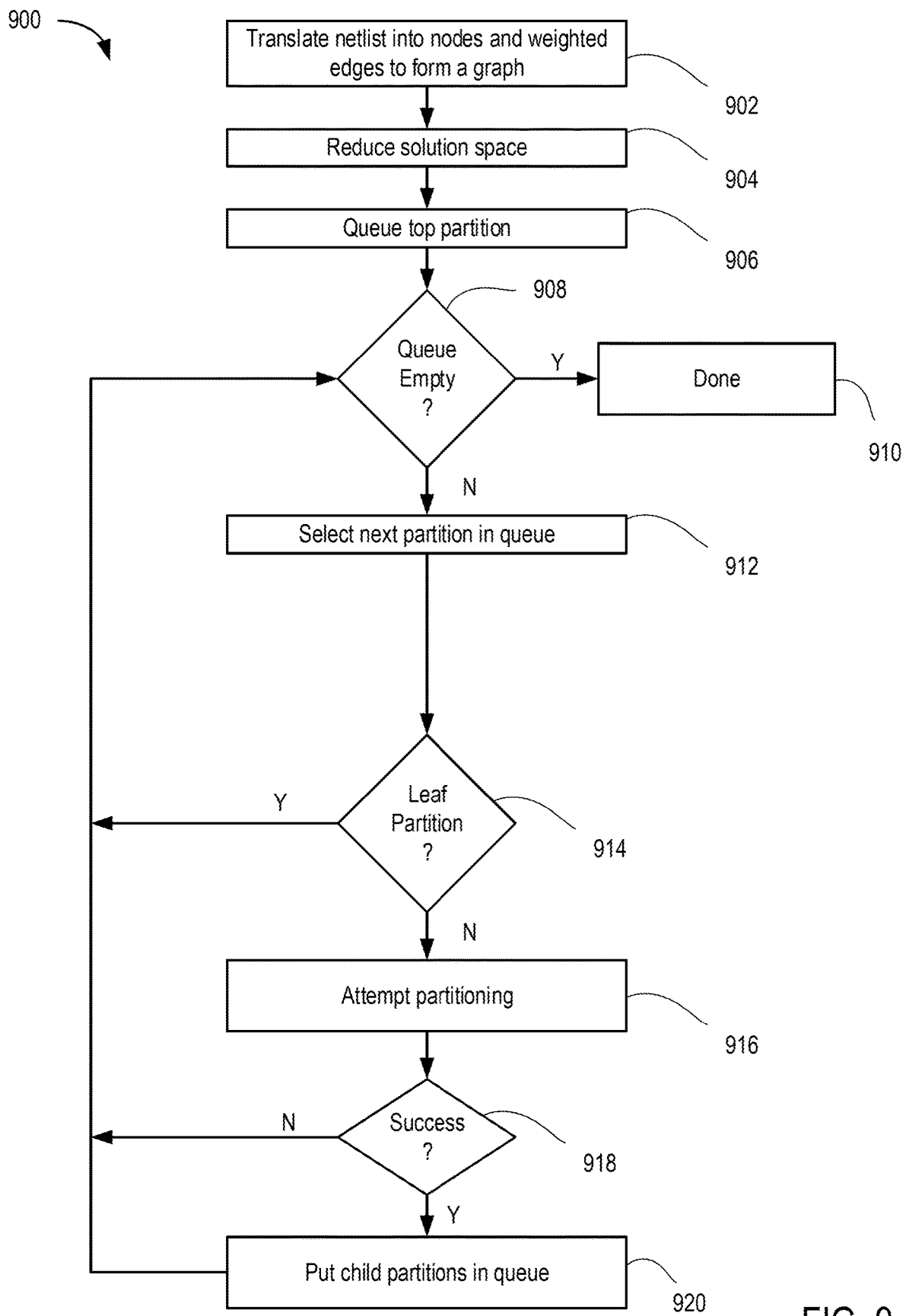
FIG. 9 is a flow diagram depicting a method of partitioning a netlist according to some examples.

FIG. 9 is a flow diagram depicting a method 900 of partitioning a netlist according to an example. The method 900 begins at step 902, where the partitioner module 604 translates the netlist into nodes and weighted edges to form a graph. Each node is either a cluster of kernels or an IO type, and will occupy either a DPE or an IO site in the SoC interface block 106, respectively. The device is translated into a two-dimensional grid of sites, where each site has the capacity for either a kernel cluster or IO. Each edge in the graph represents either a stream or a memory connection between kernels and kernels, or kernels and IOs. Kernel-to-kernel streaming connections do not require DMA no matter how far away the connecting nodes are placed. Kernel-to-IO and IO-to-kernel stream connections are either core-streaming connections which again do not need DMA, or are DMA-streaming connections which always need DMA, and hence the placement of such blocks does not get affected by DMA penalty. Thus, edges representing streaming connections are assigned a smaller weight. Memory connections require that the connecting nodes be placed at close proximity to each other, so these edges should ideally be in the same partition and have a higher weight.

At step 904, the partitioner module 604 reduces the solution space. In an example, the partitioner module 604 constrains the graph to a smaller region on the device according to a target utilization ratio. This is to limit the solution space to achieve not only faster runtime, but also to achieve better wirelength and a more compact placement for the final solution. The target ratio ensures that if the design is very large, the problem is not over-constrained such that over-utilization occurs.

At step 906, the partitioner module 604 sets the top partition and adds the top partition to a queue for processing. The top partition is the graph formed at step 902. At step 908, the partitioner module 604 determines if the queue is empty. If so, the method 900 proceeds to step 910, where the partitioning process is terminated. Otherwise, the method 900 proceeds to step 912.

At step 912, the partitioner module 604 selects the next partition in the queue. In an example, the partitioner module 604 executes a recursive bi-partitioner. The partitioner module 604 can execute an HMetis partitioning engine on the selected partition, which finds a cut that minimizes the sum of edges that will be cut, while satisfying the utilization requirements of the two child partitions. The HMetis engine used to do the partitioning can be a modified, multi-type version of the original HMetis to accommodate the fact that the nodes in the graph have multiple types of occupancy (e.g., DPE or IO). Furthermore, after each cut is made, the cut location is adjusted in the case of an uneven partitioning so the child partitions are evenly utilized. A partition is determined to be non-partitionable if the partition has a low utilization with respect to a threshold, has a small size with respect to a threshold, or if the cut cost is too high with respect to a threshold. This implies the likely need of DMAs. In this case, the partition is treated as a leaf partition and is not placed back in the queue. By the end of partitioning, every node in the graph will be assigned to a leaf partition.

Thus, at step 914, the partitioner module 604 determines if the selected partition is a leaf partition. If so, the method 900 returns to step 908 and continues with the recursive bi-partitioning process (with the leaf partition being removed from the queue). Otherwise, the method 900 proceeds to step 916. At step 916, the partitioner module 604 attempts to cut the selected partition into two child partitions. At step 918, the partitioner module 604 determines if the partitioning is successful. If not, the method 900 returns to step 908 and continues with the recursive bi-partitioning process. Otherwise, the method 900 proceeds to step 920, where the partitioner module 604 adds the child partitions to the queue and returns to step 908 to continue with the recursive bi-partitioning process.

Global Mapping

As stated above, global mapping can be based on one or more considerations, such as attempting to reduce DMAs, buffer conflicts, and/or wirelengths of routes. A netlist representing a software data flow (SDF) graph, or partitioned portions of an SDF graph, can be mapped to the DPE array 102 for implementing the application of the SDF graph. The SDF graph or partitioned portions of an SDF graph can include various program nodes, such as kernels and input/output nodes from/to the PL 110, with edges between the program nodes for data flows between the program nodes. The architecture of the DPE array 102 as described above permits one to many kernels to be mapped to each core 202, and hence, in global mapping, each cluster of kernels (having one or more kernels) is mapped to a single core 202 of a DPE 104 in the DPE array 102.

The edges can take multiple different forms in the architecture of the DPE array 102. The edges can, for example, be via shared memory, via DMA with the stream network, and/or via cascade interfaces. The mapping of various clusters of kernels to cores 202 of DPEs 104 can determine the communication mechanism that is implemented for edges between the kernels, and hence, mapping the clusters of kernels to cores 202 can attempt to map the clusters of kernels in a way that permits efficient utilization of resources and/or low latency communication. Similarly, mapping of clusters of kernels to cores 202 and input/output nodes to tiles 108 of the SoC interface block 106 can attempt to map the clusters of kernels and input/output nodes in a way that permits low latency communication. Additionally, some communication mechanisms may implement buffers. To avoid read/write collisions that may adversely impact operation of the application, mapping the buffers can attempt to map the buffers in a way that avoids such collisions.

Two clusters of kernels having an edge between the two can communicate with each other via DMA or via shared memory. In some instances, kernels may communicate via a cascade interface. This relation is established by the application and/or SDF graph and can be a constraint of mapping. However, generally, mapping clusters of kernels does not cause the clusters of kernels to implement a cascade interface. To communicate via DMA, two buffers are instantiated, with one buffer being in a memory module 204 directly accessible by one core 202 on which one cluster of kernels is mapped, and the other buffer being in a memory module 204 directly accessible by the other core 202 on which the other cluster of kernels is mapped. The buffers can then be accessed by the cores 202 via a DMA engine 216 and the stream network. To communicate via shared memory, one buffer is instantiated in a memory module 204 that both cores 202 on which the clusters of kernels are mapped can directly access. Accordingly, implementing shared memory for edges uses fewer resources of the DPE array 102 than communicating via DMA.

Kernels generally communicate via DMA when the cores 202 on which those kernels are mapped are displaced in a way that prevent sharing memory between the cores 202. As an example, referring to FIG. 3, if a first kernel is mapped to the core 202 of DPE 104-11, and a second kernel is mapped to the core 202 of DPE 104-32, the cores 202 of the DPEs 104-11, 104-32 cannot communicate by shared memory, but can communicate via DMA. In such as situation, a buffer is mapped, e.g., to the memory module 204 of the DPE 104-11, and another buffer is mapped, e.g., to the memory module 204 of the DPE 104-32, which can enable communicating via DMA. However, if, for example, a first kernel is mapped to the core 202 of DPE 104-21, and a second kernel is mapped to the core 202 of DPE 104-22, the cores 202 of the DPEs 104-21, 104-22 can communicate by shared memory with a single buffer mapped, e.g., to the memory module 204 of DPE 104-21 or DPE 104-22. Accordingly, in some examples, mapping clusters of kernels to cores 202 of DPEs 104 considers whether edges between kernels mapped to different cores 202 can be implemented by DMA or shared memory, and a mapping algorithm can attempt to map clusters of kernels to cores 202 such that communication may be by shared memory.

An edge between a kernel and an input/output node from/to the PL 110 can implement communications via DMA with a buffer being implemented directly accessible by the kernel. Latency of these communications can also be a consideration. Latency can generally depend on distance between the kernel and input/output node (e.g., due to a resistance-capacitance (RC) time constant) such that considerations of latency can be generally translated to considerations of wirelength between the kernel and input/output node. Accordingly, in some examples, mapping clusters of kernels to cores 202 of DPEs 104 and mapping input/output nodes to tiles 108 of the SoC interface block 106 considers a wirelength distance of edges between a cluster of kernels mapped to a core 202 of a DPE 104 and an input/output node mapped to a tile 108, and a mapping algorithm can attempt to map clusters of kernels to cores 202 and input/output nodes to tiles 108 such that respective wirelengths therebetween are minimized.

As indicated, buffers can be implemented by an application. Buffers can be implemented for communications, such as by shared memory and DMA. Buffers can be implemented as an internal buffer that is used by a cluster of kernels mapped to one core 202, such as a buffer used by one of the kernels or between two kernels of the cluster of kernels. Buffers can be shared between kernels mapped to different cores 202, such as for shared memory communications, and between a kernel and an input/output node from/to the PL 110. Additionally, ping-pong pairs of buffers can be implemented between kernels. Buffers are mapped to respective memory groups (e.g., a group of memory banks 212-1 to 212-4 of a memory module 204 of a DPE 104). If buffers are mapped such that multiple buffers, which may be respective whole or parts of buffers, occupy a single memory bank 212, simultaneous reads and/or writes to the memory bank 212 (e.g., collisions) can occur. Having simultaneous reads and/or writes to the same memory bank 212 can cause an arbiter associated with the memory bank 212 to serialize and control the reads and/or writes, which can adversely affect throughput, e.g., by having to stall various operations. Further, implementing a buffer that is split across two or more memory banks 212 can result in increased processing of reads and/or writes by arbiters 214, which can also adversely affect throughput. Accordingly, a consideration for mapping buffers is to assign buffers to memory groups to minimize the number of buffers mapped (e.g., by subsequent detailed mapping) to a memory bank and to assign buffers to reduce the number of buffers that are split across multiple memory banks. It is to be noted that although an algorithm may attempt to assign buffers in such a manner, in some instances, multiple buffers may be mapped to a single memory bank and/or a buffer may be mapped split across multiple memory banks.

Various algorithms are described below to address these example considerations, and other considerations may be integrated with the various algorithms below or implemented in addition to or as an alternative to the various algorithms below. An example algorithm below attempts to map clusters of kernels to cores 202 to minimize communications by DMA. Another example algorithm below attempts to assign buffers to memory groups to minimize the number of buffers mapped to a memory bank 212. A further example algorithm below attempts to map clusters of kernels to cores 202 and input/output nodes to tiles 108 to minimize wirelength between two clusters of kernels connected by a streaming edge, and between clusters of kernels and input/output nodes. Other algorithms can combine aspects of two or more of the example algorithms, and may include other aspects. Variables used in different algorithms below are listed below in Table 1 for convenience.

TABLE 1

| | |
|---|---|
| k | A cluster of kernels |
| K | A set of clusters of kernels k; k ∈ K |
| $k_{cout}$ | An output cascaded cluster of kernels; $k_{cout}$ ∈ K |
| $k_{cin}$ | An input cascaded cluster of kernels; $k_{cin}$ ∈ K |
| $k_{cas}$ | A pair of cascaded clusters of kernels; $k_{cas}$ = ($k_{cout}$, $k_{cin}$) |
| $K_{cas}$ | A set of pairs of cascaded clusters of kernels $k_{cas}$; $k_{cas}$ ∈ $K_{cas}$ |
| $k_{ib}$ | A cluster of kernels k having an internal buffer; $k_{ib}$ ∈ K |
| $k_{ssor}$ | A source cluster of kernels of clusters of kernels sharing a shared buffer; $k_{ssor}$ ∈ K |
| $k_{sdes}$ | A destination cluster of kernels of clusters of kernels sharing a shared buffer; $k_{sdes}$ ∈ K |
| $k_{shar}$ | A pair of clusters of kernels sharing shared buffers; $k_{shar}$ = ($k_{ssor}$, $k_{sdes}$) |
| $K_{shar}$ | A set of pairs of clusters of kernels $k_{shar}$ sharing shared buffers; $k_{shar}$ ∈ $K_{shar}$ |
| b | A buffer |
| B | A set of buffers b; b ∈ B |
| $b_{ping}$ | A ping buffer of a ping-pong buffer pair; $b_{ping}$ ∈ B |
| $b_{pong}$ | A pong buffer of a ping-pong buffer pair; $b_{pong}$ ∈ B |
| p | A ping-pong buffer pair; p = ($b_{ping}$, $b_{pong}$) |
| P | A set of ping-pong buffer pairs p; p ∈ P |
| $b_{ib}(k_{ib})$ | An internal buffer for cluster of kernels $k_{ib}$; $b_{ib}(k_{ib})$ ∈ B |

TABLE 1-continued

| Symbol | Description |
| --- | --- |
| $b_{ssor}(k_{ssor})$ | A buffer for source cluster of kernels $k_{ssor}$; $b_{ssor}(k_{ssor}) \in B$ |
| $b_{sdes}(k_{sdes})$ | A buffer for destination cluster of kernels $k_{sdes}$; $b_{sdes}(k_{sdes}) \in B$ |
| $z(b)$ | A size of buffer b |
| $q$ | A quantization level |
| $Q$ | A set of quantization levels, e.g., from smallest $q_0$ to largest $q_N$, $q \in Q$ |
| $z_q(b)$ | A quantized size of buffer b at quantization level q |
| $l(b)$ | A number of locks for buffer b |
| $n_{p:in}$ | An input net to the DPE array from the PL |
| $n_{p:out}$ | An output net from the DPE array to the PL |
| $N_{P:IN}$ | A set of input nets $n_{p:in}$; $n_{p:in} \in N_{P:IN}$ |
| $N_{P:OUT}$ | A set of output nets $n_{p:out}$; $n_{p:out} \in N_{P:OUT}$ |
| $n_{arr}$ | A net internal to the DPE array, each net $n_{arr}$ has an edge source and an edge destination, such as kernel-to-input/output node or input/output node-to-kernel |
| $N_{ARR}$ | A set of nets $n_{arr}$; $n_{arr} \in N_{ARR}$ |
| $k_{io}(n_{arr})$ | A cluster of kernels that is an edge source or destination for net $n_{arr}$; $k_{io}(n_{arr}) \in K$ |
| $n_p(n_{arr})$ | An input/output net that is an edge source or destination for net $n_{arr}$; $n_p(n_{arr}) \in N_P$ |
| $x$ | A column location in a DPE array |
| $X$ | A set of column locations x in a DPE array |
| $y$ | A row location in a DPE array |
| $Y$ | A set of row locations y in a DPE array |
| $c$ | A core of a DPE having a unique column location x and row location y combination in the DPE array; $c = (x, y)$ where $y \geq 1$ in the architecture previously described |
| $C$ | A set of cores c; $c \in C$ |
| $c_{cout}$ | An output cascaded core; $c_{cout} \in C$ |
| $c_{cin}$ | An input cascaded core; $c_{cin} \in C$ |
| $c_{cas}$ | A pair of cascaded cores; $c_{cas} = (c_{cout}, c_{cin})$ |
| $C_{cas}$ | A set of pairs of cascaded cores $c_{cas}$; $c_{cas} \in C_{cas}$ |
| $m$ | A memory group (e.g., collection of memory banks) of a DPE |
| $M$ | A set of memory groups m; $m \in M$ |
| $m_n(c)$ | Memory groups m neighboring core c; $m_n(c) \in M$ |
| $z_q(m)$ | A quantized size of memory group m at quantization level q |
| $t$ | A tile in a SoC interface block having a unique column location x in the DPE array; $t = (x, 0)$ in the architecture previously described |
| $T$ | A set of tiles t; $t \in T$ |
| $t_{p:in}$ | A collection of input nodes to the DPE array in a tile t from the PL |
| $t_{p:out}$ | A collection of output nodes from the DPE array in a tile t to the PL |
| $T_{P:IN}$ | A set of collections of input nodes $t_{p:in}$; $t_{p:in} \in T_{P:IN}$ |
| $T_{P:OUT}$ | A set of collections of output nodes $t_{p:out}$; $t_{p:out} \in T_{P:OUT}$ |
| $vp_{k,c}$ | A cluster placement variable; a Boolean variable indicating whether cluster of kernels k is mapped to core c; $\forall k \in K$, $\forall c \in C$. $vp_{k,c} = 1$ if cluster of kernels k is mapped to core c; otherwise, $vp_{k,c} = 0$. |
| $vb_{b,m}$ | A buffer placement variable; a Boolean variable indicating whether buffer b is mapped to memory group m, $\forall b \in B$, $\forall m \in M$. $vb_{b,m} = 1$ if buffer b is mapped to memory group m; otherwise, $vb_{b,m} = 0$. |
| $vbs_{b,m}$ | A source buffer placement variable; a Boolean variable indicating whether a source buffer b is mapped to memory group m; $\forall b \in B$, $\forall m \in M$. $vbs_{b,m} = 1$ if buffer b is a source buffer and is mapped to memory group m; otherwise, $vbs_{b,m} = 0$. |
| $vbd_{b,m}$ | A destination buffer placement variable; a Boolean variable indicating whether a destination buffer b is mapped to memory group m; $\forall b \in B$, $\forall m \in M$. $vbd_{b,m} = 1$ if buffer b is a destination buffer and is mapped to memory group m; otherwise, $vbd_{b,m} = 0$. |
| $vd_b$ | A buffer splitting variable; a Boolean variable indicating whether a buffer b is split for DMA; $\forall b \in B$. $vd_b = 1$ if buffer b is split; otherwise, $vb_{b,m} = 0$. If $vd_b = 1$, then $vbs_{b,m}$ and $vbd_{b,m}$ are 1 for two different memory groups m, and $vb_{b,m}$ is also 1 for both of those memory groups m. |
| $vs_{m,q}$ | A memory group slack variable; a Boolean variable indicating whether buffers b mapped to memory group m have a cumulative quantized size $z_q(b)$ at quantization level q that exceeds the quantized size $z_q(m)$ of the memory group m at the quantization level q; $\forall m \in M$, $\forall q \in Q$. $vs_{m,q} = 1$ if $\sum_{b \in B} vb_{b,m} \cdot z_q(b) > z_q(m)$; otherwise, $vs_{m,q} = 0$. |
| $vio_{n_p, t_p}$ | An input/output placement variable; a Boolean variable indicating whether input/output net $n_p$ is mapped to a collection of input/output nodes $t_p$; $\forall n_{p:in} \in N_{P:IN}$, $\forall n_{p:out} \in N_{P:OUT}$, $\forall t_{p:in} \in T_{P:IN}$, $\forall t_{p:out} \in T_{P:OUT}$. $vio_{n_p, t_p} = 1$ if net $n_p$ is mapped to node $t_p$; otherwise, $vio_{n_p, t_p} = 0$. |

| | |
|---|---|
| $px_g$ | An column placement variable; an integer variable indicating a value of the column in the DPE array in which generic component g is placed, where generic component g can be a cluster of kernels k (which is mapped to a core c) or an input/output net $n_p$ (which is mapped to a collection of input nodes $t_p$). $$px_k = \sum_{c=x \in X\mid Y} x \cdot vp_{k,c}, \forall k \in K \text{ and } px_{n_p} = \sum_{t_p=x \in X} x \cdot vio_{n_p,t_p}, \forall n_p \in N_p$$ |
| $py_g$ | A row placement variable; an integer variable indicating a value of the row in the DPE array in which generic component g is placed, where generic component g can be a cluster of kernels k (which is mapped to a core c) or an input/output net $n_p$ (which is mapped to a collection of input nodes $t_p$). $$py_k = \sum_{c=y \in Y\mid X} y \cdot vp_{k,c}, \forall k \in K \text{ and } py_{n_p} = 0, \forall n_p \in N_p$$ |
| $dx_{n_{arr}}$ | A column distance variable; an integer variable indicating an orthogonal distance between columns of a mapped location of a core c or collection of input/output nodes $t_p$ in the DPE array of an edge source $k_{io}(n_{arr})$ or $n_p(n_{arr})$ and a mapped location of a core c or collection of input/output nodes $t_p$ in the DPE of an edge destination $k_{io}(n_{arr})$ or $n_p(n_{arr})$ for net $n_{arr}$ |
| $dy_{n_{arr}}$ | A row distance variable; an integer variable indicating an orthogonal distance between rows of a mapped location of a core c or collection of input/output nodes $t_p$ in the DPE array of an edge source $k_{io}(n_{arr})$ or $n_p(n_{arr})$ and a mapped location of a core c or collection of input/output nodes $t_p$ in the DPE of an edge destination $k_{io}(n_{arr})$ or $n_p(n_{arr})$ for net $n_{arr}$ |

Given variables listed in Table 1, various constraints can be created for an algorithm for mapping that attempts to map clusters of kernels to cores 202 to minimize communications by DMA. In the example described below, the algorithm is an ILP algorithm, although other examples can implement a different algorithm.

Constraints can include assignment constraints that provide constraints on the resources to which a kernel, buffer, etc., can be mapped. Each cluster of kernels k in the set K of clusters of kernels is to be mapped to one core c, and hence, the cluster placement variable $vp_{k,c}$ for each cluster of kernels k is constrained to be one for a single core c, as indicated by Equation (1) below.

$$\sum_{c \in C} vp_{k,c} = 1, \forall k \in K \qquad \text{Eq. (1)}$$

Each input net $n_{p:in}$ to the DPE array from the PL is to be mapped to one collection of input nodes $t_{p:in}$ of the DPE array (e.g., to one tile 108), and each output net $n_{p:out}$ from the DPE array to the PL is to be mapped to one collection of output nodes $t_{p:out}$ of the DPE array (e.g., to one tile 108). Accordingly, the input/output placement variable $vio_{n_p,t_p}$ for each net $n_{p:in}$, $n_{p:out}$ is constrained to be one for a single collection of nodes $t_{p:in}$, $t_{p:out}$, as indicated by Equations (2) and (3) below.

$$\sum_{t_{p:in} \in T_{P:IN}} vio_{n_p,t_p} = 1, \forall n_{p:in} \in N_{P:IN} \qquad \text{Eq. (2)}$$

$$\sum_{t_{p:out} \in T_{P:OUT}} vio_{n_p,t_p} = 1, \forall n_{p:out} \in N_{P:OUT} \qquad \text{Eq. (3)}$$

In this example, each buffer can be considered as having two parts—a source buffer and a destination buffer. A destination buffer can generally be a replica of the source buffer. In this formulation, when communications are by shared memory, one buffer is implemented for communications between two clusters of kernels, and that buffer can be considered both the source buffer and the destination buffer. When communications are by DMA, two buffers are implemented between a source cluster of kernels $k_{ssor}$ and a destination cluster of kernels $k_{sdes}$, where one buffer is the source buffer $b_{ssor}(k_{ssor})$ and the other is the destination buffer $b_{sdes}(k_{sdes})$. In this formulation, each source buffer $b_{ssor}(k_{ssor})$ and destination buffer $b_{sdes}(k_{sdes})$ should be placed at one memory group m, and hence, the source buffer placement variable $vbs_{b,m}$ and the destination buffer placement variable $vbd_{b,m}$ for each buffer b is constrained to be one for a single memory group m, as indicated by Equations (4) and (5) below.

$$\sum_{m \in M} vbs_{b,m} = 1, \forall b \in B \qquad \text{Eq. (4)}$$

$$\sum_{m \in M} vbd_{b,m} = 1, \forall b \in B \qquad \text{Eq. (5)}$$

To further explain the source and destination buffer placement variables $vbs_{b,m}$, $vbd_{b,m}$, when communications are by shared memory using buffer b, the source and destination buffer placement variables $vbs_{b,m}$, $vbd_{b,m}$ are one for a same memory group m indicating that the source and destination buffers are mapped to a same memory group m. In such circumstances, the buffer splitting variable $vd_b$ for the buffer b is zero indicating that the buffer b is not split. However, when communications are by DMA using buffer b including a source buffer $b_{ssor}(k_{ssor})$ and a destination buffer $b_{sdes}(k_{sdes})$, the source and destination buffer placement variables $vbs_{b,m}$, $vbd_{b,m}$ are one for different memory groups m indicating that the source and destination buffers $b_{ssor}(k_{ssor})$, $b_{sdes}(k_{sdes})$ are mapped to different memory groups m. In such circumstances, the buffer splitting variable $vd_b$ for the buffer b is one indicating that the buffer b is split.

Constraints can also include resource constraints that provide constraints on what any physical resource can accommodate, such as capacities of stream switches, etc. Each core c can have up to one cluster of kernels k, and hence, the cluster placement variable $vp_{k,c}$ for each core c is constrained to be one for no more than one cluster of kernels k, as indicated by Equation (6) below.

$$0 \leq \sum_{k \in K} vp_{k,c} \leq 1, \forall c \in C \qquad \text{Eq. (6)}$$

Each tile 108 has an architecturally defined number of channels to and from the PL 110. In this formulation, the channels to and from the PL 110 (via PL interface 404) are addressed and not channels to and from the NoC 116 (via selector block 416 and NoC stream interface 408). The formulation described herein can be extended to include channels to/from the NoC 116. As an example, the tile 108 can have eight input channels and six output channels from/to the PL 110. The defined number of channels form the collection of input nodes $t_{p:in}$ and collection of output nodes $t_{p:out}$. Hence, each collection of input nodes $t_{p:in}$ can have up to the architecturally defined number of input nets $n_{p:in}$, and hence, the input/output placement variable $vio_{n_p,t_p}$ for each collection of input nodes $t_{p:in}$ is constrained to be no more than an architecturally defined number of input channels $X_{ISINT}$ of input nets $n_{p:in}$, as indicated by Equation (7). Similarly, each collection of output nodes $t_{p:out}$ can have up to the architecturally defined number of output nets $n_{p:out}$, and hence, the input/output placement variable $vio_{n_p,t_p}$ for each collection of output nodes $t_{p:out}$ is constrained to be no more than an architecturally defined number of output channels $X_{OSINT}$ of output nets $n_{p:out}$, as indicated by Equation (8).

$$0 \leq \sum_{n_{p:in} \in N_{P:IN}} vio_{n_p,t_p} \leq X_{ISINT}, \forall t_{p:in} \in T_{P:IN} \qquad \text{Eq. (7)}$$

$$0 \leq \sum_{n_{p:out} \in N_{P:OUT}} vio_{n_p,t_p} \leq X_{OSINT}, \forall t_{p:out} \in T_{P:OUT} \qquad \text{Eq. (8)}$$

Each memory group has a size (e.g., 32,768 or $2^{15}$ bytes) that can accommodate one or more buffers b, and hence, each memory group m is constrained to have buffers b mapped to the respective memory group m that have a cumulative size that is no more than the size $X_M$ of the memory group m, as indicated by Equation (9) below.

$$0 \leq \sum_{b \in B} vb_{b,m} \cdot z(b) \leq X_M, \forall m \in M \qquad \text{Eq. (9)}$$

Each memory group m can accommodate an architecturally defined number of locks (e.g., sixteen) for one or more buffers b on the memory group m, and hence, the number of locks l(b) for buffers b mapped to a memory group m is constrained to be no more than the number $X_l$ of locks that the memory group m can accommodate, as indicated by Equation (10) below.

$$0 \leq \sum_{b \in B} vb_{b,m} \cdot \ell(b) \leq X_\ell, \forall m \in M \qquad \text{Eq. (10)}$$

Other resource constraints can be implemented in addition to and/or as an alternative to the above resource constraints, such as based on the architecture of the device to which the application is mapped. For example, capacities of various components, such as channels of a DMA engine, could additionally be constraints.

The application may implement various functionality that leads to relation constraints being implemented. In some instances, ping-pong buffers can be implemented for throughput reasons. The ping buffer $b_{ping}$ and the pong buffer $b_{pong}$ have equal sizes. The ping buffer $b_{ping}$ and the pong buffer $b_{pong}$ are to be mapped to the same memory group m, and hence, the buffer placement variables $vb_{b,m}$ for the ping buffer $b_{ping}$ and the pong buffer $b_{pong}$ are constrained to be equal for each memory group m, as indicated by Equation (11) below.

$$vb_{b_{ping},m} = vb_{b_{pong},m}, \forall p \in P, \forall m \in M \qquad \text{Eq. (11)}$$

In some instances, cascaded clusters of kernels $k_{cas}$ can be implemented in a cascaded cores $c_{cas}$. The cascaded clusters of kernels $k_{cas}$ are to be mapped to architecturally cascaded cores $c_{cas}$, and hence, the cluster placement variables $vp_{k,c}$ for pairs of cascaded clusters of kernels $k_{cas}$ are constrained to be equal for each pair of cascaded cores $c_{cas}$, as indicated by Equation (12) below.

$$vp_{k_o,c_o} = vp_{k_i,c_i}, \forall k_{cas} \in K_{cas}, \forall c_{cas} \in C_{cas} \qquad \text{Eq. (12)}$$

An internal buffer $b_{ib}(k_{ib})$ (e.g., a buffer internal to a kernel or between two kernels of a cluster of kernels) is to be mapped in a memory group $m_n(c)$ neighboring the core c to which the cluster of kernels $k_{ib}$ that implements the internal buffer $b_{ib}(k_{ib})$ is mapped. Hence, the cluster placement variable $vp_{k,c}$ of the cluster of kernels $k_{ib}$ is constrained to be equal to the sum of the buffer placement variables $vb_{b,m}$ of the internal buffer $b_{ib}(k_{ib})$ in the memory group $m_n(c)$ neighboring the core c, as indicated by Equation (13) below.

$$vp_{k_{ib},c} - \sum_{m \in n(c)} vb_{b_{ib}(k_{ib}),m} = 0, \forall k_{ib} \in K, \forall c \in C \qquad \text{Eq. (13)}$$

In some instances, buffers b can be shared between kernels of different clusters of kernels k, such as for DMA. In such instances, a source buffer $b_{ssor}(k_{ssor})$ is to be mapped to a memory group $m_n(c)$ neighboring the core c to which the source cluster of kernels $k_{ssor}$ is mapped, and a destination buffer $b_{sdes}(k_{sdes})$ is to be mapped to a memory group $m_n(c)$ neighboring the core c to which the destination cluster of kernels $k_{sdes}$ is mapped. Hence, the cluster placement variable $vp_{k,c}$ of the source cluster of kernels $k_{ssor}$ is constrained to be equal to the sum of the source buffer placement variables $vbs_{b,m}$ of the buffer $b_{ssor}(k_{ssor})$ in the memory group $m_n(c)$ neighboring the core c, as indicated by Equation (14) below, and the cluster placement variable $vp_{k,c}$ of the destination cluster of kernels $k_{sdes}$ is constrained to be equal to the sum of the destination buffer placement variables $vbd_{b,m}$ of the buffer $b_{sdes}(k_{sdes})$ in the memory group $m_n(c)$ neighboring the core c, as indicated by Equation (15) below.

$$vp_{k_{ssor},c} - \sum_{m \in n(c)} vbs_{b_{ssor}(k_{ssor}),m} = 0, \forall k_{ssor} \in K, \forall c \in C \quad \text{Eq. (14)}$$

$$vp_{k_{sdes},c} - \sum_{m \in n(c)} vbd_{b_{sdes}(k_{sdes}),m} = 0, \forall k_{sdes} \in K, \forall c \in C \quad \text{Eq. (15)}$$

Additional constraints can be implemented for relations between buffers as indicated by Equations (16) through (19) below. The constraints of Equations (16) and (17) indicate that the placement of a buffer b as shown by the buffer placement variable should be equal to or greater than the source buffer placement variable $vbs_{b,m}$ and destination buffer placement variable $vbd_{b,m}$ for that buffer b at a memory group m. If the buffer b is split (e.g., for DMA), the buffer placement variable $Vb_{b,m}$ should be one for the memory groups m to which the source buffer of the buffer b and the destination buffer of the buffer b are mapped, and the source and destination buffer placement variables $vbs_{b,m}$, $vbd_{b,m}$ are one for the respective memory groups m. Further, the buffer splitting variable $vd_b$ is set to one in this case. If the buffer b is not split, the buffer placement variable $Vb_{b,m}$ and the source and destination buffer placement variables $vbd_{b,m}$, $vbd_{b,m}$ should be one for the same memory group m, ane the buffer splitting variable $vd_b$ is set to zero in this case. The constraint of Equation (18) constrains the buffer placement variable $vb_{b,m}$ from being more than the source and destination buffer placement variables $vbs_{b,m}$, $vbd_{b,m}$ indicating that if a buffer b is mapped to a memory group m, so should at least one of the source or destination buffers. The constraint of Equation (19) constrains the destination buffer placement variable $vbd_{b,m}$ from being more than the source buffer placement variable $vbs_{b,m}$ and buffer splitting variable $vd_b$ indicating that, if the buffer b is split, the destination buffer and the source buffer are mapped to different memory groups m, or if the buffer is not split, the destination buffer and the source buffer are mapped to a same memory group m $$vb_{b,m} \geq vbs_{b,m}, \forall b \in B, \forall m \in M \quad \text{Eq. (16)}$$

$$vb_{b,m} \geq vbd_{b,m}, \forall b \in B, \forall m \in M \quad \text{Eq. (17)}$$

$$vb_{b,m} \leq vbd_{b,m} + vbs_{b,m}, \forall b \in B, \forall m \in M \quad \text{Eq. (18)}$$

$$vbd_{b,m} \leq vbs_{b,m} + vd_b, \forall b \in B, \forall m \in M \quad \text{Eq. (19)}$$

With the various constraints identified (e.g. by Equations (1) through (19)), an objective function can be defined that can be minimized, such as by an ILP algorithm. An objective function can minimize a sum of weighted buffer splitting variables $vd_b$ for buffers b of the set B of buffers as indicated by Equation (20) below, where $DMA_{COST}$ is some constant (e.g., an arbitrary constant) that can add a weight to the buffer splitting variables $vd_b$.

$$\min\left(\sum_{b \in B} vd_b \cdot DMA_{COST}\right) \quad \text{Eq. (20)}$$

Again, given variables listed in Table 1, various constraints can be created for an algorithm for mapping that maps buffers b to memory groups m to reduce the number of buffers b mapped (e.g., by subsequent detailed mapping) to a memory bank. In the example described below, the algorithm is an ILP algorithm, although other examples can implement a different algorithm.

In considering mapping buffers b, the size z(b) of each buffer b is quantized in some examples. Generally, each memory bank has a size that is $2^N$ bytes, as defined in the architecture. In some examples, and as assumed herein, each memory bank has a same size (e.g., N is the same for each memory bank). Quantized sizes can be defined based on the size of the memory banks. A smallest quantized size at a smallest quantization level $q_0$ can be some arbitrarily determined and/or smallest practical buffer size (e.g., $2^5$ bytes or 32 bytes) that would be implemented in a memory bank, where the smallest quantization level $q_0$ is the logarithm of the smallest quantized size to the base 2 (e.g., $5=\log_2 2^5$). A largest quantized size at a largest quantization level $q_N$ can be the largest buffer size able to be implemented wholly in a single memory bank (e.g., $2^N$ bytes), where the largest quantization level $q_N$ is the logarithm of the largest quantized size to the base 2 (e.g., $N=\log_2 2^N$). Other quantized sizes and respective quantization levels can be defined for each power of 2 between the smallest quantized size and the largest quantized size (e.g., size (level): $2^5$(5), $2^6$(6), ..., $2^N$(N)). Accordingly, each memory group m has quantized sizes $z_q(m)$ for quantization levels q from a smallest level $q_0$ to a largest level $q_N$.

To quantize a buffer b, a size z(b) of the buffer is increased to the next power of 2, and the quantized size $z_q(b)$ of the buffer corresponding to a quantization level q is the increased size divided by the quantization size at the respective quantization level q. As an example, assume a size z(b) of a buffer b is 100 bytes. The size of the buffer is increased to 128, which is the next power of 2 (e.g., $2^7$ bytes). Assume that quantized sizes (and corresponding quantization levels) are defined from $2^5$ to $2^{13}$. The quantized size $z_q(b)$ of the buffer b at quantization level 5 is 4 (e.g., $128/2^5$); the quantized size $z_q(b)$ of the buffer b at quantization level 6 is 2 (e.g., $128/2^6$); the quantized size $z_q(b)$ of the buffer b at quantization level 7 is 1 (e.g., $128/2^7$); and the quantized size $z_q(b)$ of the buffer b at each of quantization levels 8 through 13 is less than one. When the quantized size $z_q(b)$ of the buffer b at a quantization level is less than one, the quantized size $z_q(b)$ of the buffer b at that quantization level is assigned one, and in the above example, the quantized size $z_q(b)$ of the buffer b at each of quantization levels 8 through 13 is assigned one. By introducing quantized sizes $z_q(b)$ of the buffers b, buffers b may be able to be mapped to memory groups m such that subsequent detailed mapping maps each buffer b to a memory bank such that the buffer does not spill over into another memory bank.

A resource constraint can include that each memory group m is constrained to have no more buffers b mapped to the respective memory group m than have a cumulative size that is less than or equal to the size $X_M$ of the memory group m, as indicated by Equation (9) above. An assignment constraint can indicate how many and which buffers are mapped to a memory bank based on the quantized sizes $z_q(b)$ of the buffers b, quantized sizes $z_q(m)$ of the memory groups m, and memory group slack variables $vs_{m,q}$ as indicated by Equation (21) below.

$$0 \le \sum_{b \in B} vb_{b,m} \cdot z_q(b) \le z_q(m) + \left(vs_{m,q} \cdot \sum_{b \in B} z_q(b)\right), \quad \text{Eq. (21)}$$

$$\forall m \in M, \forall q \in Q$$

The constraint of Equation (21) effectively indicates instances where, and at what quantization levels q, buffers b mapped to a memory group m have quantized sizes $z_q(b)$ that exceed the quantized size $z_q(m)$ of the memory group m by determining when the memory group slack variable $vs_{m,q}$ is to be set to one. The memory group slack variable $vs_{m,q}$ can be multiplied by any arbitrarily large number, e.g., instead of the sum of the quantized sizes $z_q(b)$ of the buffers b.

With the various constraints identified (e.g. by Equations (9) and (21)), an objective function can be defined that can be minimized, such as by an ILP algorithm. An objective function can minimize a sum of weighted memory group slack variable $vs_{m,q}$ as indicated by Equation (22) below, where $SLACK_{COST}$ is some constant (e.g., an arbitrary constant) that can add a weight to the memory group slack variable $vs_{m,q}$.

$$\min\left(\sum_{m \in M} \sum_{q \in Q} vs_{m,q} \cdot SLACK_{COST}\right) \quad \text{Eq. (22)}$$

By minimizing the memory group slack variable $vs_{m,q}$ at the different quantization levels $q \in Q$, splitting of buffers b between memory groups m can be minimized. Additionally, by minimizing the memory group slack variable $vs_{m,q}$ at the largest quantization level $q_N$, one memory bank of a memory group m can be assigned one buffer b to the extent possible.

Again, given variables listed in Table 1, various constraints can be created for an algorithm for mapping that map clusters of kernels k to cores 202 and input/output nets $n_p$ to tiles 108 to minimize wirelength between two clusters of kernels connected by a streaming edge, and between clusters of kernels and input/output nets $n_p$. In the example described below, the algorithm is an ILP algorithm, although other examples can implement a different algorithm.

Constraints can include assignment constraints. Some assignment constraints are included in the listing of Table 1, e.g., for the column and row placement variables $px_g$, $py_g$. Each cluster of kernels $k_{io}(n_{arr})$ that is an edge for an internal net $p_{arr}$ in the set K of clusters of kernels is to be mapped to one column location x and to one row location y, and hence, the cluster placement variable $vp_{k,c}$ for each cluster of kernels $k_{io}(n_{arr})$ is constrained to be one for a single column location x and to a single row location y, as indicated by Equations (23) and (24) below. Each input/output net $n_p(n_{arr})$ that is an edge for an internal net $p_{arr}$ is to be mapped to one column location x, and hence, the input/output placement variable $vio_{n_p,t_p}$ for each input/output net $n_p(n_{arr})$ is constrained to be one for a single column location x, as indicated by Equation (25) below.

$$\sum_{c=x \in X|Y} vp_{k_{io}(n_{arr}),c} = 1, \forall n_{arr} \in N_{ARR} \quad \text{Eq. (23)}$$

$$\sum_{c=y \in Y|X} vp_{k_{io}(n_{arr}),c} = 1, \forall n_{arr} \in N_{ARR} \quad \text{Eq. (24)}$$

$$\sum_{t_p=x \in X} vio_{n_p(n_{arr}),t_p} = 1, \forall n_{arr} \in N_{ARR} \quad \text{Eq. (25)}$$

The constraints of Equations (23) through (25) can be generally restated as Equations (1) through (3) above.

Constraints can include relation constraints. Relation constraints can define the column and row distance variables $dx_{n_{arr}}$, $dy_{n_{arr}}$ between the core c to which the cluster of kernels $k_{io}(n_{arr})$ is mapped and the collection of input/output nodes $t_p$ to which the input/output net $n_p(n_{arr})$ for each internal net $n_{arr}$ is mapped, as indicated by Equations (26) through (29) below.

$$px_{k_{io}}(n_{arr}) - px_{n_p}(n_{arr}) + dx_{n_{arr}} \ge 0, \forall n_{arr} \in N_{ARR} \quad \text{Eq. (26)}$$

$$px_{n_p}(n_{arr}) - px_{k_{io}}(n_{arr}) + dx_{n_{arr}} \ge 0, \forall n_{arr} \in N_{ARR} \quad \text{Eq. (27)}$$

$$py_{k_{io}}(n_{arr}) - py_{n_p}(n_{arr}) + dy_{n_{arr}} \ge 0, \forall n_{arr} \in N_{ARR} \quad \text{Eq. (28)}$$

$$py_{n_p}(n_{arr}) - py_{k_{io}}(n_{arr}) + dy_{n_{arr}} \ge 0, \forall n_{arr} \in N_{ARR} \quad \text{Eq. (29)}$$

The column and row distance variables $dx_{n_{arr}}$, $dy_{n_{arr}}$ can be generalized as indicated by Equations (30) and (31) below.

$$|px_{k_{io}}(p_{arr}) - px_{n_p}(p_{arr})| = dx_{n_{arr}}, \forall n_{arr} \in N_{ARR} \quad \text{Eq. (30)}$$

$$|py_{k_{io}}(p_{arr}) - py_{n_p}(n_{arr})| = dy_{n_{arr}}, \forall n_{arr} \in N_{ARR} \quad \text{Eq. (31)}$$

With the various constraints identified (e.g. by Equations (23) through (29)), an objective function can be defined that can be minimized, such as by an ILP algorithm. An objective function can minimize a sum of weighted Manhattan distances between mapped edge sources and edge destinations of internal nets $n_{arr}$, as indicated by Equation (32) below, where $WIRE_{COST}$ is some constant (e.g., an arbitrary constant) that can add a weight to the Manhattan distances of the internal nets $n_{arr}$. In some instances, different weights can be assigned to different internal nets $n_{arr}$, e.g., such that $WIRE_{COST}(n_{arr})$ is a function of the internal net $n_{arr}$.

$$\min\left(\sum_{n_{arr} \in N_{ARR}} (dx_{n_{arr}} + dy_{n_{arr}}) \cdot WIRE_{COST}\right) \quad \text{Eq. (32)}$$

The two or more of algorithms described above can be combined to map various components. Equation (33) below illustrates an objective function that can be used to map components and that considers buffer minimization, buffer conflict, and wirelength minimization.

$$\min\left(\begin{array}{c}\left(\sum_{b \in B} vd_b \cdot DMA_{COST}\right) + \left(\sum_{m \in M} \sum_{q \in Q} vs_{m,q} \cdot SLACK_{COST}\right) + \\ \left(\sum_{n_{arr} \in N_{arr}} (dx_{n_{arr}} + dy_{n_{arr}}) \cdot WIRE_{COST}\right)\end{array}\right) \quad \text{Eq. (33)}$$

Detailed Mapping

The detailed placement performed by the compiler mapping module 704 formulates the problem of assigning IOs from the programmable logic (PLIOs) to individual channels within the SoC interface block 106. The detailed placement algorithm also assigns buffers to individual memory banks along with assignment of an offset value within each bank.

Figure 10:
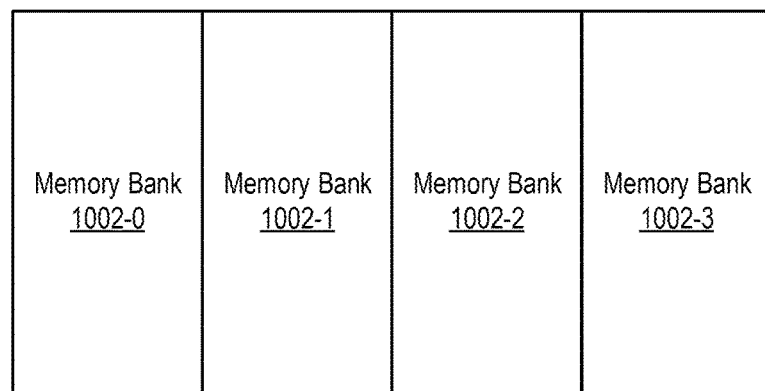
FIG. 10 is a block diagram depicting a configuration of memory having a plurality of memory banks according to some examples.

FIG. 10 is a block diagram depicting an example configuration of memory having a plurality of memory banks 1002 (e.g., four memory banks 1002-0 through 1002-3).

Figure 11:
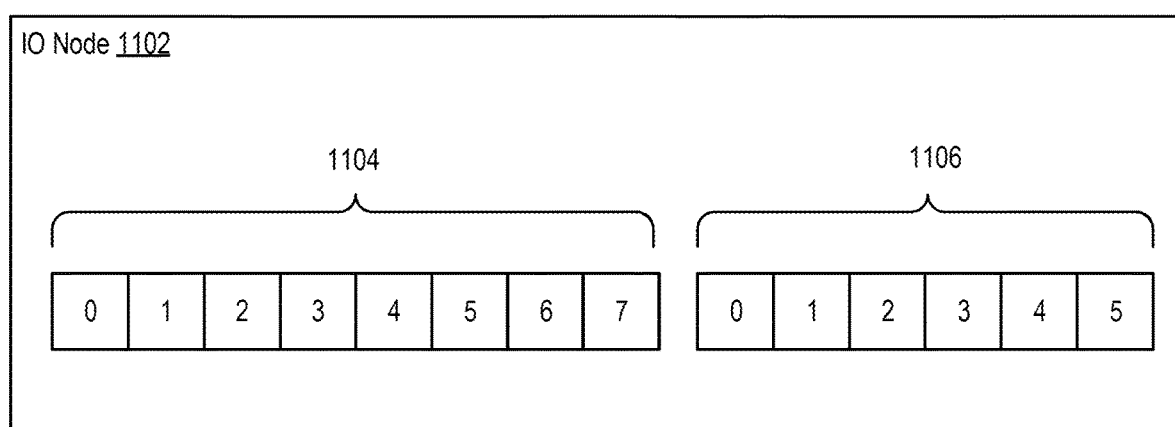
FIG. 11 is a block diagram depicting a configuration of an IO node in an SoC interface block having incoming channels and outgoing channels according to some examples.

Global placement described above treats the memory group as one block of memory, whereas the detailed placement algorithm works with the individual banks 1002 of the memory. FIG. 11 is a block diagram depicting an example configuration of an IO node 1102 in the SoC interface block 106 having incoming channels 1104 and outgoing channels 1106. In the example, the IO node 1102 includes eight incoming channels 1104 and six outgoing channels 1106.

For detailed placement, the problem statement is as follows: given a design that has been globally placed, the compiler mapping module 704 needs to place buffers into memory banks 1002 along with offset assignment within each bank, and place PLIOs onto incoming channels 1104 and outgoing channels 1106. The following notations are used:

B: set of buffers
InP: set of incoming (PL to DPE array) PLIOs
OutP: set of outgoing (DPE array to PL) PLIOs
InCh: set of incoming channels in SoC interface block 106
OutCh: set of outgoing channels in SoC interface block 106

For each buffer b in B:
$s_b$ is the size of the buffer
$O_b$ is the offset value of the buffer within a memory group
$BO_b$ is the offset value of the buffer within a memory bank
$M_b$ is the starting address of the memory group in which buffer b is placed
$A_b$ the absolute address of the buffer
$SI_b$ the start bank index of the buffer
$EI_b$ the end bank index of the buffer
$V_{b_{bk}}$ Boolean variable, is 1 when buffer b ends in bank k The bounds for some of the variables defined above are (in an example):

$$0 \leq SI_b \leq 3$$

$$0 \leq EI_b \leq 3$$

$$0 \leq BO_b < 8192$$

$$0 \leq O_b < 32{,}768$$

Further, for each PLIO p in InP and OutP and channel c in InS and OutS, detailed placement includes the following variable:
$v_{ipc}$: 1 if p is at c Having defined the variables/notations, detailed placement creates the following constraints, which are divided into four types: (1) assignment constraints; (2) resource constraints; (3) relation constraints; and (4) optimization constraints.

For assignment constraints, constraints are needed to assign buffers and PLIOs to their respective locations on the DPE array tiles. Hence, for each incoming PLIO p in InP: Sum($v_{ipc}$: c in InCh)=1. For each outgoing PLIO p in OutP: Sum($v_{ipc}$: c in OutCh)=1. Each buffer should "end" at exactly one bank in the memory group where it has been placed (by the global placer). Hence, for each buffer b in B: Sum($vb_{bk}$: k in {0, 1, 2, 3})=1 and $E_{ib}$*8192=Sum ($vk_{bk}$*$b_a$: k in {0, 1, 2, 3}), where $b_a$ is the bank address.

For resource constraints, constraints are needed to ensure device capacities with respect to memory bank and IO channels are honored. Each IO channel can have a maximum of one PLIO. Hence, for each IO channel c in InCh: 0≤Sum ($v_{ipc}$: p in InP)≤1. For each IO channel c in OutCh: 0≤Sum ($v_{ipc}$: p in OutP)≤1. Since the mapping of buffers to banks is many-to-one, constraints are added to ensure that two buffers do not overlap with one another. Hence, for each pair of buffers b1 and b2 that are mapped on a memory group:

$$A_{b1}+s_{b1} \leq A_{b2}+SI_{b1b2-1}*\text{MAX}$$

$$A_{b2}+s_{b2} \leq A_{b1}+SI_{b1b2-2}*\text{MAX}$$

Where $SI_{b1b2-1}$ and $SI_{b1b2-2}$ are two binary slack variables for the pair (b1, b2), of which only one of them must be one. Hence, the following resource constraint is also present: $SI_{b1b2-1}+SI_{b1b2-2}=1$.

For relation constraints, the constraints need to capture relationships between the different elements of the design. For example, buffers often come in pairs, as ping-pong buffers, for better throughput. The ping and pong buffers are identical in size and global placement ensures that they are both placed in the same memory group. However, within a memory group, ping and pong buffers should be placed on different banks in order to allow them to operate in parallel. Hence, for each ping-pong buffer pair (b1, b2) in B: 0≤Sum ($vb_{b1k}+vb_{b2k}$)≤1, for each k in {0, 1, 2, 3}. Also, certain relationships are established between the offset variables:

$$O_b=(SI_b*8192)+BO_b$$

$$0 \leq O_b+s_b-(EI_b*8192)<8192$$

It is important to understand that only buffers larger than the size of a bank are allowed to occupy more than one bank. In the case where a buffer is larger than the size of a bank, the buffer will occupy more than one bank. However, the detailed placement algorithm enforces such that large buffers start from the beginning of a bank. Hence, the bank offset variable is set to zero: $BO_b=0$ for buffers larger than 8192.

For optimization constraints, the constraints need to capture all other special requirements, which may be optional but desired most of the time. First, it is sub-optimal to place a buffer such that the buffer uses more than one memory bank if the buffer is small enough to fit within one memory bank. Hence, a constraint can be added to ensure that the start and end bank indices for such buffers are the same: $SI_b=EI_b$. Also, it is desirable to place less buffers per memory bank. Hence, for each memory bank, slack variables can be introduced to be used by the objective function. The slack variables can be tied to the bank assignment variables $vk_{bk}$:

$$\text{Sum}(vk_{bk}) \leq 1+SI_k, \text{ for } k \text{ in } \{0,1,2,3\}$$

for each memory group, and for all memory buffers placed in that memory group.

Having established all the variables and constraints, the only thing remaining is the objective function that is minimized. In examples, the requirement is to ensure the least amount of buffers are assigned to a bank as possible in order to avoid any stalls due to concurrent buffer access. Hence, in examples, the objective function is:
Min(Sum($SI_k$*BANK$_{conflict-cost}$)), for all banks k, and for all memory groups,
Where BANK$_{conflict-cost}$ is a constant used to control the weight of the slack variables.

As will be appreciated by one having ordinary skill in the art, some examples disclosed herein may be embodied as a system, method, or computer program product. Accordingly, aspects may take the form of an entirely hardware embodiment, an entirely software embodiment (including firmware, resident software, micro-code, etc.), or a combination of software and hardware aspects. Furthermore, aspects may take the form of a computer program product embodied in one or more non-transitory computer readable storage medium(s) having computer readable program instruction code embodied thereon. A computer readable storage medium may be or include a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing.

Computer program instruction code for carrying out operations for aspects described herein may be written in any combination of one or more programming languages, including an object oriented programming language such as Java, Smalltalk, C++ or the like and conventional procedural programming languages, such as the C programming language or similar programming languages. The program instruction code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Aspects of various examples have been described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instruction code. These computer program instruction code may be provided to a processor of a general purpose computer, special purpose computer, or other programmable data processing apparatus to produce a machine, such that the program instruction code, which execute via the processor of the computer or other programmable data processing apparatus, create means for implementing the functions/acts specified in the flowchart and/or block diagram block or blocks.

These computer program instruction code may also be stored in a computer readable medium that can direct a computer, other programmable data processing apparatus, or other devices to function in a particular manner, such that the program instruction code stored in the computer readable medium produce an article of manufacture including program instruction code which implement the function/act specified in the flowchart and/or block diagram block or blocks.

The computer program instruction code may also be loaded onto a computer, other programmable data processing apparatus, or other devices to cause a series of operational steps to be performed on the computer, other programmable apparatus or other devices to produce a computer implemented process such that the program instruction code which execute on the computer or other programmable apparatus provide processes for implementing the functions/acts specified in the flowchart and/or block diagram block or blocks.

The flowchart and block diagrams in the figures illustrate the architecture, functionality, and operation of possible implementations of systems, methods, and computer program products according to various examples. In this regard, each block in the flowchart or block diagrams may represent a module, segment, or portion of program instruction code, which comprises one or more executable program instruction code for implementing the specified logical function(s). In some implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer program instruction code.

While the foregoing is directed to specific examples, other and further examples may be devised without departing from the basic scope thereof, and the scope thereof is determined by the claims that follow.

What is claimed is:

1. A method for compiling, the method comprising:
   by a processor-based system:
      obtaining a netlist of an application, the netlist containing program nodes and respective edges between the program nodes, the application to be implemented on a device comprising an array of data processing engines;
      partitioning the netlist into a plurality of partitions;
      for each of the plurality of partitions:
         generating a global mapping of the program nodes based on a representation of the array of data processing engines and using an integer linear programming (ILP) algorithm;
         generating a detailed mapping of the program nodes based on the global mapping; and
      translating the detailed mapping for each of the plurality of partitions to a file.

2. The method of claim 1, wherein partitioning the netlist comprises:
   reducing a solution space by constraining the netlist to a portion of the array of data processing engines based on a target utilization ratio.

3. The method of claim 1, wherein partitioning the netlist comprises:
   performing recursive bi-partitioning of the netlist to generate the plurality of partitions until each of the plurality of partitions comprises a leaf partition, the leaf partition being non-partitionable based on one or more metrics.

4. The method of claim 3, wherein the one or more metrics comprises at least one of a utilization metric, a size metric, and a cost metric.

5. The method of claim 3, wherein performing the recursive bi-partitioning comprises cutting the netlist into two portions that minimizes a sum of weights of the edges.

6. The method of claim 5, wherein the two portions of the netlist are adjusted based on resource utilization of each of the two portions.

7. The method of claim 5, wherein each of the edges comprises a stream or a memory connection, and wherein edges that are streams have a smaller weight than edges that are memory connections.

8. A non-transitory computer readable medium having stored thereon instruction that when executed by a processor cause the processor to perform a method for compiling, the method comprising:
   obtaining a netlist of an application, the netlist containing program nodes and respective edges between the program nodes, the application to be implemented on a device comprising an array of data processing engines;

partitioning the netlist into a plurality of partitions;

for each of the plurality of partitions:

generating a global mapping of the program nodes based on a representation of the array of data processing engines and using an integer linear programming (ILP) algorithm;

generating a detailed mapping of the program nodes based on the global mapping; and translating the detailed mapping for each of the plurality of partitions to a file.

9. The non-transitory computer readable medium of claim 8, wherein partitioning the netlist comprises:

reducing a solution space by constraining the netlist to a portion of the array of data processing engines based on a target utilization ratio.

10. The non-transitory computer readable medium of claim 8, wherein partitioning the netlist comprises:

performing recursive bi-partitioning of the netlist to generate the plurality of partitions until each of the plurality of partitions comprises a leaf partition, the leaf partition being non-partitionable based on one or more metrics.

11. The non-transitory computer readable medium of claim 10, wherein the one or more metrics comprises at least one of a utilization metric, a size metric, and a cost metric.

12. The non-transitory computer readable medium of claim 10, wherein performing the recursive bi-partitioning comprises cutting the netlist into two portions that minimizes a sum of weights of the edges.

13. The non-transitory computer readable medium of claim 12, wherein the two portions of the netlist are adjusted based on resource utilization of each of the two portions.

14. The non-transitory computer readable medium of claim 12, wherein each of the edges comprises a stream or a memory connection, and wherein edges that are streams have a smaller weight than edges that are memory connections.

15. A design system comprising:

a processor; and a memory coupled to the processor, the memory storing instruction code, the processor being configured to execute the instruction code to perform:

obtaining a netlist of an application, the netlist containing program nodes and respective edges between the program nodes, the application to be implemented on a device comprising an array of data processing engines;

partitioning the netlist into a plurality of partitions;

for each of the plurality of partitions:

generating a global mapping of the program nodes based on a representation of the array of data processing engines and using an integer linear programming (ILP) algorithm;

generating a detailed mapping of the program nodes based on the global mapping; and translating the detailed mapping for each of the plurality of partitions to a file.

16. The design system of claim 15, wherein the partitioning comprises:

reducing a solution space by constraining the netlist to a portion of the array of data processing engines based on a target utilization ratio.

17. The design system of claim 15, wherein the partitioning comprises:

performing recursive bi-partitioning of the netlist to generate the plurality of partitions until each of the plurality of partitions comprises a leaf partition, the leaf partition being non-partitionable based on one or more metrics.

18. The design system of claim 17, wherein the one or more metrics comprises at least one of a utilization metric, a size metric, and a cost metric.

19. The design system of claim 17, wherein performing the recursive bi-partitioning comprises cutting the netlist into two portions that minimizes a sum of weights of the edges.

20. The design system of claim 19, wherein the two portions of the netlist are adjusted based on resource utilization of each of the two portions.

* * * * *